United States Patent [19]
Arai et al.

[11] Patent Number: 5,369,282
[45] Date of Patent: Nov. 29, 1994

[54] ELECTRON BEAM EXPOSURE METHOD AND SYSTEM FOR EXPOSING A PATTERN ON A SUBSTRATE WITH AN IMPROVED ACCURACY AND THROUGHPUT

[75] Inventors: Soichiro Arai; Hiroshi Yasuda; Junichi Kai; Yoshihisa Oae, all of Kawasaki, Japan

[73] Assignee: Fujitsu Limited, Kawasaki, Japan

[21] Appl. No.: 98,875

[22] Filed: Jul. 29, 1993

[30] Foreign Application Priority Data

| Aug. 3, 1992 [JP] | Japan | 4-206790 |
| Feb. 19, 1993 [JP] | Japan | 5-030902 |
| Jul. 13, 1993 [JP] | Japan | 5-173388 |

[51] Int. Cl.$^5$ ............................ H01J 37/302
[52] U.S. Cl. ..................... 250/492.22; 250/492.23; 250/398
[58] Field of Search .......... 250/492.22, 492.23, 250/492.2, 492.3, 398

[56] References Cited

U.S. PATENT DOCUMENTS

| 4,153,843 | 5/1979 | Pease | 250/492.2 |
| 4,724,328 | 2/1988 | Lischke | 250/492.2 |
| 4,879,605 | 11/1989 | Warkentin et al. | 358/296 |
| 5,214,291 | 5/1993 | Hirai et al. | 250/492.2 |

FOREIGN PATENT DOCUMENTS 2-10967  1/1990  Japan .

Primary Examiner—Jack I. Berman
Attorney, Agent, or Firm—Staas & Halsey

[57] ABSTRACT

An electron beam exposure process includes a step of producing a plurality of electron beam elements from a single electron beam by shaping and radiating the plurality of electron beam elements on a substrate. The exposure is achieved in a plurality of times with respective electron beam patterns by means of different sets of electron beam elements, wherein the electron beam elements of different sets are produced simultaneously and deflected simultaneously so as to scan the substrate consecutively. The electron beam elements in one set are offset from corresponding electron beam elements of the other set by a pitch of M/N wherein N represents the number of the electron beam sets and M is an integer smaller than N.

22 Claims, 29 Drawing Sheets

110

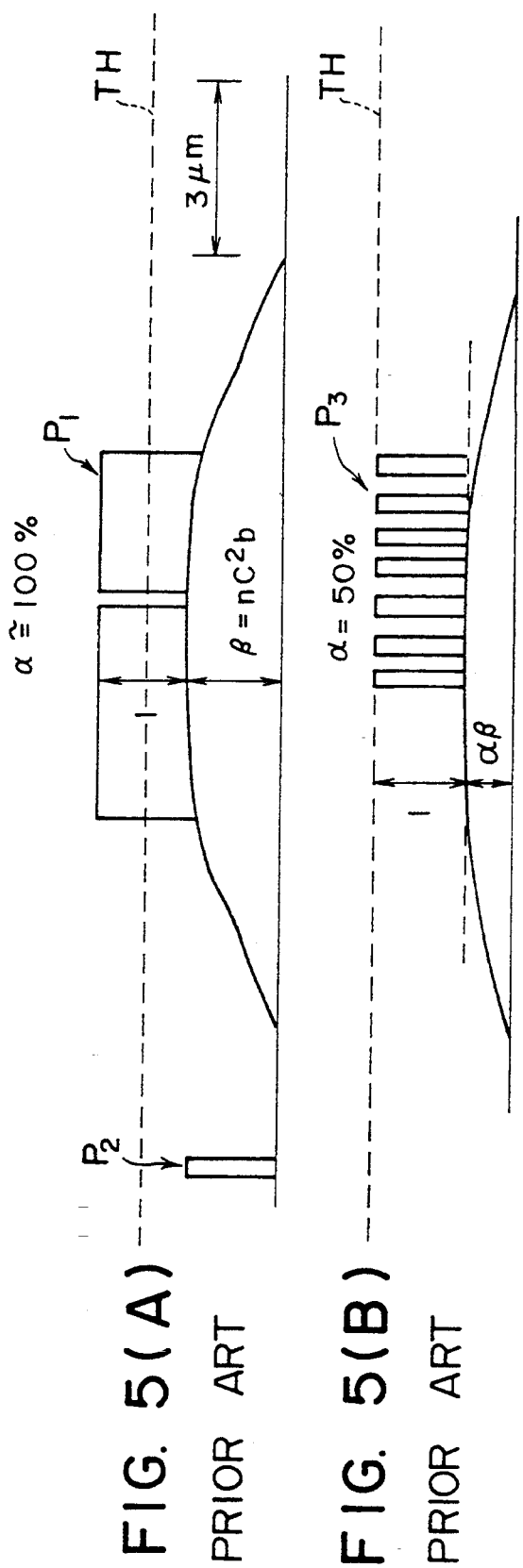

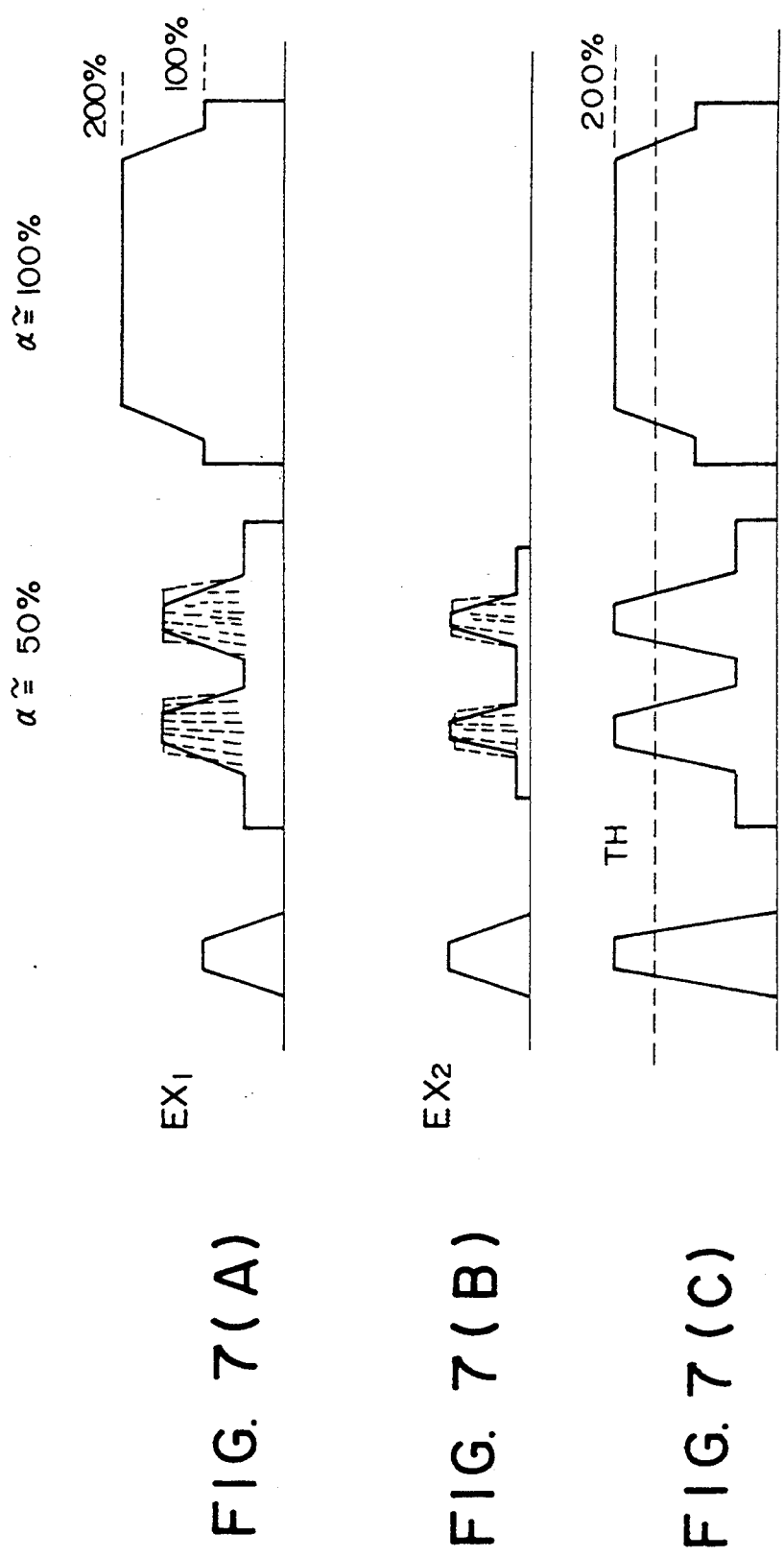

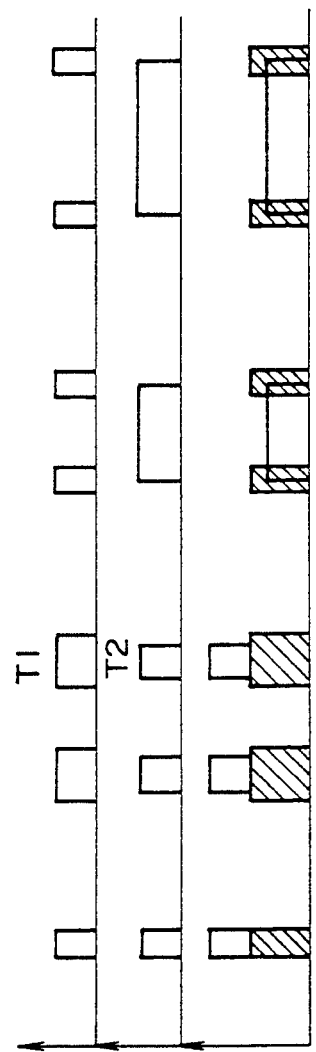

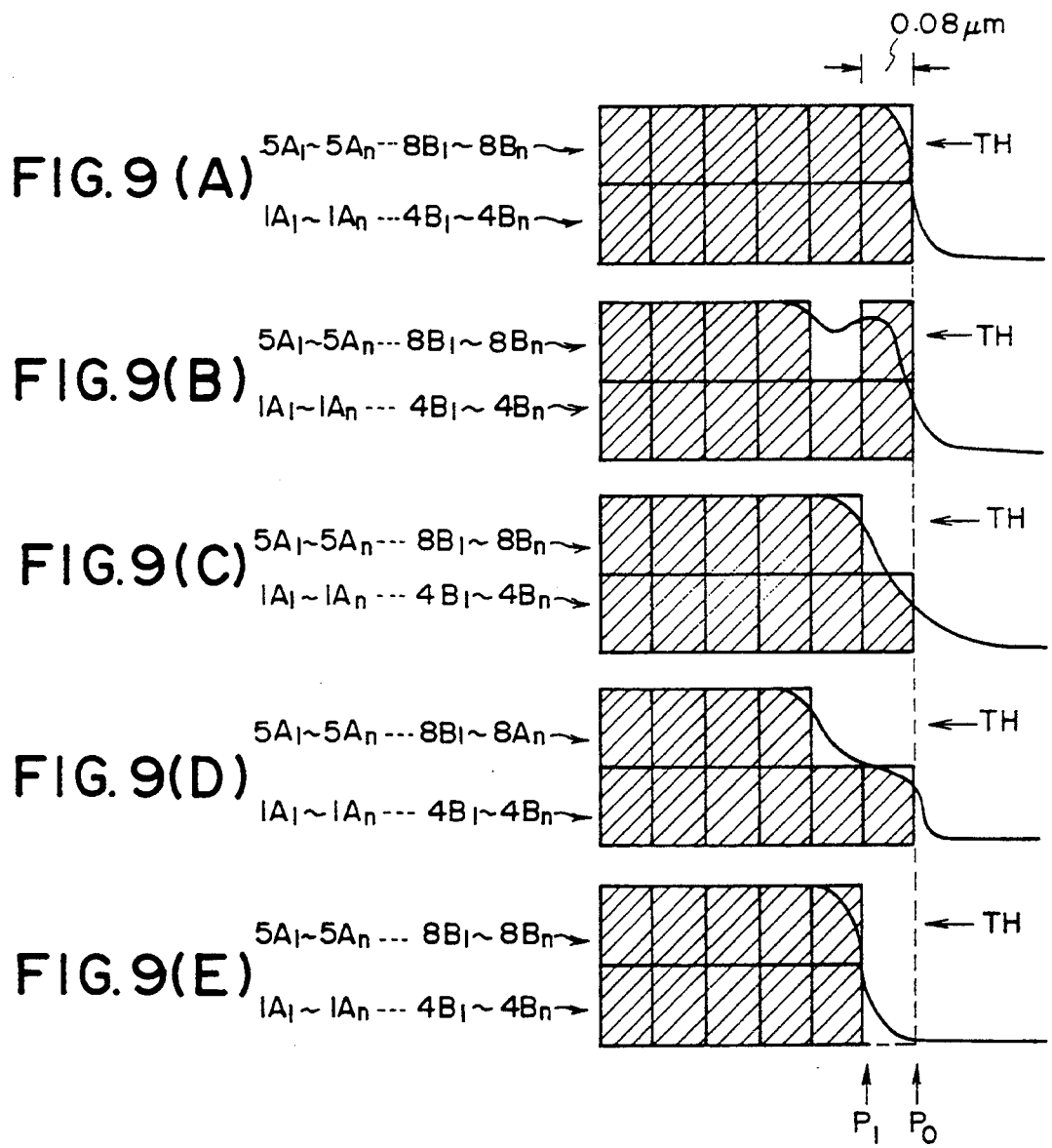

ELECTRON BEAM EXPOSURE METHOD AND SYSTEM FOR EXPOSING A PATTERN ON A SUBSTRATE WITH AN IMPROVED ACCURACY AND THROUGHPUT

BACKGROUND OF THE INVENTION

The present invention generally relates to fabrication of semiconductor devices and more particularly to a process for exposing a semiconductor pattern on an object such as a semiconductor substrate with an improved accuracy.

Electron beam lithography is a key process for fabricating advanced semiconductor integrated circuits having a very large integration density. With the use of electron beam lithography, a device pattern having a line width of less than 0.05 $\mu$m can be fabricated easily with an alignment error of less than 0.02 $\mu$m. Thus, the electron beam lithography is expected to play a major role in the fabrication of future integrated circuits such as DRAMs having a storage capacity of 256 Mbits or more.

In the fabrication of memory devices, the throughput of production is an essential factor, in addition to the resolution of the device patterning. In this respect, the electron beam lithography that uses a single, focused electron beam for the exposure, is disadvantageous as compared with the conventional optical exposure processes that expose the entire device pattern in one single shot. On the other hand, such a conventional optical exposure process is reaching its limit of resolution, and there is a situation that one has to rely upon the electron beam exposure process for the fabrication of the large capacity memory devices of the future.

Under such circumstances, various efforts are being made for improving the throughput of the electron beam exposure process. For example, the inventor of the present invention has previously proposed a so-called block exposure process wherein the device pattern is decomposed into a number of fundamental patterns and the electron beam is shaped in accordance with one of these fundamental patterns. With the use of the block exposure process, one can now achieve a throughput of about 1 cm$^2$/sec.

On the other hand, in the fabrication of semiconductor devices such as microprocessors that include complex, irregular patterns, there arises a problem in the block exposure system in that the efficiency of exposure is decreased significantly. In the block exposure processes, one can shape the electron beam to have a pattern that is selected from a combination of small, fundamental patterns, with high efficiency. When exposing an irregular pattern not included in the set of fundamental patterns, on the other hand, one has to shape the electron beam according to the variable-shaping process by energizing the electrostatic or electromagnetic deflectors with a controlled magnitude. However, such a variable-shaping process decreases the exposure throughput due to the setting time of the deflectors or operational speed of the control system that requires exact control of the deflectors.

In order to achieve a high exposure throughput in the fabrication of semiconductor devices that include complex, irregular patterns, the use of a so-called blanking aperture array is proposed. In the blanking aperture array, the exposure patterns are represented in the form of a dot pattern that includes small exposure dots. Thereby, the electron beam exposure system forms each of the dots by using a blanking aperture array that turns on and turns off the electron beam in correspondence to each of the exposure dots.

FIG. 1 shows the construction of a conventional electron beam exposure system that uses the technique of blanking aperture array. Referring to the drawing, the electron beam exposure system is generally formed from an electron optical system 100 for producing and focusing an electron beam and a control system 200 for controlling the optical system 100.

The electron optical system 100 includes electron gun 104 as a source of the electron beam. The electron gun 104 includes a cathode electrode 101, a grid electrode 102 and an anode electrode 103, and produces the electron beam generally in the direction of a predetermined optical axis O in the form of a spreading beam.

The electron beam thus produced by the electron gun 104 is passed through a shaping aperture 105a formed in an aperture plate 105. The aperture plate 105 is provided such that the aperture 105a is in alignment with the optical axis O and shapes the incident electron beam to have a rectangular cross section.

The electron beam thus shaped is received by an electron lens 107 that focuses the incident electron beam upon a blanking aperture array (designated hereinafter as BAA) mask 110. It should be noted that the lens 107 projects the image of the rectangular aperture 105a on the BAA mask 110. As will be described later with reference to FIG. 2, the BAA mask 110 carries a number of apertures in correspondence to a number of exposure dots formed on a semiconductor substrate, and each aperture is provided with an electrostatic deflector that is controlled in response to a control signal E. Thereby, the apertures on the BAA mask 110 allows the passage of the electron beam as it is when in the unenergized state. When energized, on the other hand, the electron beam is deflected from the optical axis O upon passage through the aperture. As a result, the substrate is formed with exposure dots in correspondence to the apertures that are in the unenergized state.

The electron beam thus passed through the BAA mask 110 is then focused at a point f1 that is located on the optical axis O after passing through electron lenses 108 and 116. There, the image of the addressed apertures on the BAA 110 is demagnified at the point f1. The electron beam thus focused is then passed through a round aperture 117a formed in a blanking plate 117 and further focused on the surface of a substrate 123 that is held on a movable stage 126, after passing through electron lenses 119 and 120 that form another demagnifying optical system. There, the electron lens 120 serves for an objective lens and includes various coils such as correction coils 120 and 121 for focusing compensation and astigmatic compensation as well as deflection coils 124 and 125 for moving the focused electron beam over the surface of the substrate 123.

In order to control the exposure operation, the electron beam exposure system of FIG. 1 includes the control system 200, wherein the control system 200 includes memory devices such as a magnetic tape device 201 and magnetic disk devices 202, 203 that are provided to store various data of the device pattern of the semiconductor device to be written. In the illustrated example, the magnetic tape device 201 is used for storing various design parameters, the magnetic disk device 202 is used for storing the exposure pattern data, and the magnetic disk device 203 is used for storing the pattern of the apertures on the BAA mask 110.

The data stored in the memory devices is read out by a CPU 204 and is transferred to an interface device 205 after data decompression. There, the data for specifying the pattern on the block mask 110 is extracted and stored in a data memory 206. The data stored in the data memory 206 is then transferred to a first control unit 207 that produces the foregoing control signal E and supplies the same to the deflectors provided on each aperture on the BAA mask 110. In response thereto, the energization of the apertures on the BAA mask 110 is controlled and hence the formation of the exposure dots on the substrate 123.

The first control unit 207 further supplies a control signal to a blanking control unit 210 that in turn produces a blanking signal for shutting off the electron beam. This blanking signal is then converted to an analog signal SB in a D/A converter 211 and the analog signal SB is supplied to a deflector 115 that causes a deflection of the electron beam away from the optical axis O. In response to this, the electron beam misses the round aperture 117a and disappears from surface of the substrate 123.

The interface device 205 further extracts and supplies the data for controlling the movement of the electron beam on the surface of the substrate 123 to a second control unit 212. In response thereto, the control unit 212 produces a control signal for controlling the deflection of the electron beam on the surface of the substrate 123 and supplies the same to a wafer deflection control unit 215 that in turn produces and supplies deflection control signals to D/A converters 216 and 217. The D/A converters 216 and 217 in turn, produce drive signals SW1 and SW2 for driving the deflectors respectively and supply the same to the deflectors 124 and 125 for causing the deflection of the electron beam. Thereby, the position of the stage 126 is detected by a laser interferometer 214 and the wafer deflection control unit 215 modifies the output deflection control signals and hence the drive signals SW1 and SW2 according to the result of measurement of the stage position by the laser interferometer. Further, the second control unit 212 produces a control signal that causes a lateral movement of the stage 126.

FIG. 2 shows an example of the BAA mask 110 that is used in the electron beam exposure system of FIG. 22.

Referring to FIG. 2, the mask 110 has a size b of about 1200 $\mu$m in the scanning direction of the electron beam and a size c of about 3200 $\mu$m in the direction perpendicular to the scanning direction. The mask 110 carries thereon a number of aperture rows $1A_1$-$1A_n$, $1B_1$-$1B_n$, $2A_1$-$2A_n$, . . . , $8A_1$-$8A_n$, $8B_1$-$8B_n$. In FIG. 2, the aperture row that includes the apertures $1A_1$-$1A_n$ is designated as 1A, the aperture row that includes the apertures $1B_1$-$1B_n$ is designated as 1B . . . Thereby, the apertures $1A_1$-$1A_n$ form an A-group aperture row, while the apertures $1B_1$-$1B_n$ form a B-group aperture row. In the mask 110 of FIG. 2, it should be noted that the apertures forming the B-group aperture rows such as 1B are formed with a displacement with respect to the apertures forming the A-group aperture rows, such as 1A, by one pitch. In the mask of the illustrated example, each aperture row includes 64 apertures each having a size S of 25 $\mu$m for each edge and disposed with a pitch 2S of 50 $\mu$m. Thereby, the BAA mask 110 carries thereon sixteen aperture rows 1A–8B such that the aperture rows are repeated in the scanning direction with a pitch of repetition of 2S. In correspondence to each aperture, a square dot pattern having a size of 0.08 $\mu$m $\times$ 0.08 $\mu$m is formed on the substrate 123. Of course, the number of the apertures repeated in the scanning direction is not limited to sixteen but can be much larger such as one thousand or more.

In the conventional electron beam exposure system of FIG. 1 that uses the BAA mask 110, therefore, it will be noted that a number of flat electron beam arrays, each being an assembly of a number of electron beams aligned in the direction generally perpendicular to the scanning direction, are formed. By deflecting such flat electron beam arrays in the scanning direction, a semiconductor pattern is exposed on the semiconductor substrate 123 as an assembly of exposure dots. Thereby, by disposing the apertures alternately on the mask 110, one can avoid the electron beams from coming excessively close to each other, and the problem of Coulomb interaction between the electron beams can be avoided.

FIG. 3 shows the apertures on the BAA mask 110 and the electrostatic deflectors that cooperate therewith.

Referring to FIG. 3, each electrostatic deflector includes a ground electrode GND indicated by cross-hatching and a drive electrode ACT that opposes the ground electrode GND with the aperture intervening therebetween, and the BAA control circuit of FIG. 22 includes a plurality of drive circuits in correspondence to each of the aperture columns $COL_1$, $COL_2$, $COL_3$, . . . , $COL_{128}$. It should be noted that each aperture column includes a plurality of apertures aligned in the scanning direction in FIG. 3. As will be described in detail later, those apertures aligned to form an aperture column such as the column $COL_2$ are supplied with the same drive signal consecutively with a delay that corresponds to the beam scanning speed. Thereby, a square dot pattern having a size of 0.08 $\mu$m $\times$ 0.08 $\mu$m is exposed repeatedly on the substrate 123 by the electron beam that has passed through the apertures. In order to achieve such a multiple exposure, the apertures are supplied, in each aperture column, with the drive signal via respective lines. FIG. 3 shows such a line collectively by a symbol L. Illustrations of such, lines corresponding to the other aperture columns are omitted for the sake of simplicity.

FIG. 4 shows an example of the exposure pattern formed on the substrate 123 by means of the electron beam shaped by the BAA mask 110 of FIG. 2. Referring to FIG. 4, it will be noted that the exposure pattern is formed of a two-dimensional array of the exposure dots of A-group corresponding to the A-group apertures such as $1A_1$ and the exposure dots of B-group corresponding to the B-group apertures such as $1B_1$. Each exposure dot typically has the size of 0.08 $\mu$m $\times$ 0.08 $\mu$m as described before. Thereby, by turning on and turning off the exposure dots by controlling the BAA mask 110, it becomes possible to modify the exposure pattern with the smallest area of 0.08 $\times$ 0.08 $\mu$m.

In the electron beam exposure process described heretofore, it should be noted that the exposure pattern is written on the substrate 123 by causing a photochemical reaction in the photoresist that covers the surface of the substrate 123 as a result of radiation of the electron beam. Thereby, the incident electron beam induces a backscattering of electrons at the substrate 123, and these backscattered electrons cause a photochemical reaction in the photoresist.

FIGS. 5(A) and 5(B) show an example of exposure of various patterns on the substrate 123 achieved by the apparatus of FIG. 1.

Referring to FIG. 5(A), the drawing shows the energy or dose of the electron beam supplied to an electron beam resist that covers the surface of the substrate for a case where the exposed device pattern designated as $P_1$ has a pattern density a close to 100%. The pattern density herein means the percentage of the region of the substrate that is exposed by the electron beam. In FIG. 5(A), the threshold of exposure energy is represented as TH. When the dose of the electron beam exceeds the foregoing threshold TH, the exposure of the electron beam resist occurs. On the other hand, when the dose does not reach the threshold TH, no exposure is made.

In the exposure of FIG. 5(A), it should be noted that there is a substantial background exposure as represented by $\beta$, which is caused by the backscattering of electrons from the substrate. Such a background exposure is known as the "proximity effect." When such a background exposure occurs, the dose of the electron beam for the device pattern $P_1$ increases inevitably as indicated in FIG. 5(A). As a natural consequence, such a background exposure does not occur in small, isolated patterns such as a pattern $P_2$ where the backscattering of the electrons is small. Thereby, there occurs a difference in the dose of exposure between the region where a dense pattern is exposed and the region where a small isolated pattern is formed.

A similar change of dose occurs also between the device patterns having a large pattern density such as the pattern $P_1$ and the device patterns having less dense pattern density such as a pattern $P_3$ shown in FIG. 5(B). The device pattern $P_3$ of FIG. 5(B) has a pattern density of 50%, for example, and there occurs a backscattering of the electrons with a magnitude represented as $\alpha\beta$.

Under such a situation, it will be understood that the variation of exposure, caused by the backscattering of electrons, has to be compensated for such that there is a uniform background exposure. Otherwise, there occurs a case where small isolated patterns such as the pattern $P_2$ of FIG. 3(B) are not exposed.

In order to compensate for the proximity effect, there is a proposal to expose the pattern on the substrate a plurality of times. However, such a multiple exposure process generally includes the step of scanning the substrate in more than three or four times, and because of this, the conventional process for compensating for the proximity effect has caused a problem of low exposure throughput. It should be noted that the electron beam exposure process is conducted on the substrate in the form of parallel stripes such that the exposure starts at an end of a stripe and proceeds to the other end of the stripe by scanning the electron beam along the stripe. When the exposure for that stripe is completed, the exposure for the next stripe is repeated. In such an exposure process, one cannot increase the speed of scanning beyond a certain limit because of the limitation in the response speed of the laser interferometer that drives the stage of the substrate. Further, an excessive increase in the scanning speed tends to cause a vortex current to flow through the substrate as a result of leak flux of the electron lens interlinking with the substrate. Thereby, such a vortex current tends to cause a deviation in the electron beam on the substrate. In addition, the repetition of the exposure process, more than three or four times, increases the amount of information to be processed for preparing the exposure data that is used in each exposure process. In view of the limitation in the data transfer rate of the control system 200, however, it is difficult to repeat the exposure process more than twice.

SUMMARY OF THE INVENTION

Accordingly, it is a general object of the present invention to provide a novel and useful electron beam exposure process wherein the foregoing problems are eliminated.

Another and more specific object of the present invention is to provide an electron beam exposure process wherein the proximity effect is successfully eliminated without sacrificing the resolution or accuracy of the exposed device pattern as well as the throughput of exposure.

Another object of the present invention is to provide an electron beam exposure process wherein a delicate modification of exposure pattern is possible while maintaining a high throughput.

Another object of the present invention is to provide a process for exposing a pattern on an object by means of an electron beam, comprising the steps of:

producing an electron beam such that said electron beam travels toward said object;

shaping said electron beam to produce a plurality of electron beam elements each having the same size and shape such that said plurality of electron beam elements form an electron beam pattern; and exposing said electron beam pattern on said object in the form of an array of exposure dots arranged with a predetermined pitch, by radiating said electron beam elements on said object;

said step of shaping being conducted so as to form said plurality of electron beam elements in the form of a first group beam elements and a second group beam elements, such that said first group beam elements form a first electron beam pattern and such that said second group beam elements form a second, different electron beam pattern, said first and second group beam elements being formed simultaneously by shaping a common electron beam;

said step of exposing being conducted as a first step and a second step such that, in said first step, said first electron beam pattern is exposed on an exposure field defined on said object, and such that, in said second step, said second electron beam pattern is exposed on said same exposure field on said object.

According to the present invention, one can compensate for the proximity effect associated with the exposure of the first beam pattern by conducting an exposure of the second electron beam pattern. In the present invention set forth above, it should be noted that the first and second exposure patterns are formed simultaneously by shaping the same electron beam by a BAA mask. Thereby, the exposure of the first electron beam pattern and the second exposure pattern are achieved consecutively such that the exposure of the second exposure pattern follows immediately behind the first exposure pattern, without repeating the exposure process. As a result, there occurs no decrease in the exposure throughput.

Another object of the present invention is to provide a process for exposing a pattern on an object by means of an electron beam, comprising the steps of:

shaping a single electron beam to form a plurality of electron beam elements each having the same size and shape such that said plurality of electron beam elements extend generally parallel with each other and form an electron beam pattern; and radiating said plurality of electron beam elements on said object to expose said pattern on said object as an assembly of exposure dots arranged with a predetermined pitch;

said step of shaping the electron beam being conducted to form said plurality of electron beam elements as a plurality of electron beam groups each including said electron beam elements that extend parallel with each other and in alignment in a first direction, and such that said electron beam elements aligned in said first direction are repeated in a second direction perpendicular to said first direction, said step of shaping the electron beam being further conducted to form said electron beams of said plurality of electron beam groups simultaneously;

wherein an electron beam element included in one of said electron beam groups are formed, with respect to an electron beam element in other electron beam groups, with an offset of said predetermined pitch multiplied by M/N in at least one of said first and second directions, wherein N stands for the number of the electron beam groups and M represents an arbitrary integer smaller than N.

According to the present invention, those exposure dots formed by the electron beam elements that are included in one electron beam group and those exposure dots formed by the electron beam elements in the other electron beam group are formed on the object in a partially overlapped state. Thereby, by changing the exposure pattern in each electron beam group, one can achieve a minute and delicate modification of the exposure pattern. Such a delicate modification of the exposure pattern is particularly suitable for compensating for the proximity effect. As the electron beam elements of different electron beam groups are formed simultaneously, the exposure process of the present invention can be conducted at a high speed.

Another object of the present invention is to provide an electron beam exposure system for exposing a pattern on an object by a focused electron beam, comprising: electron beam source means for producing an electron beam and emitting the same along an optical axis; focusing means provided on said optical axis for focusing said electron beam on said object; electron beam shaping means for forming a plurality of electron beam elements each having the same size and shape by shaping said electron beam; shaping control means for controlling said electron beam shaping means such that said plurality of electron beam elements are formed according to a desired exposure pattern; and deflection means for deflecting said plurality of shaped electron beam elements with respect to said optical axis;

said electron beam shaping means comprising a mask plate provided with a plurality of apertures for shaping said single electron beam to form said plurality of electron beam elements in correspondence to said plurality of apertures, and a deflection device provided on each of said plurality of apertures for deflecting said electron beam element upon passage through said aperture;

said shaping control means producing a drive signal to said deflection device and forming said plurality of electron beam elements according to said desired exposure pattern;

said plurality of apertures on said mask being arranged in a first direction and in a second, different direction with a predetermined pitch to form a plurality of aperture groups each extending in said first direction and repeated in said second direction for N times with said predetermined pitch;

said shaping control means supplying drive signals to said deflection devices in said plurality of aperture groups such that the drive signal supplied to one of the aperture groups is independent from the drive signals supplied to the other aperture groups;

wherein, in each of said aperture groups, said aperture is repeated in said first direction with said predetermined pitch, such that said aperture is offset from a corresponding aperture in an adjacent aperture group by M/N pitches in at least one of said first and second directions wherein N stands for the number of aperture groups and M represents an arbitrary integer smaller than N.

According to the present invention, one can modify the exposure pattern in each aperture group such that different patterns are repeatedly exposed in a partially overlapped relationship. Thereby, one can achieve a minute, delicate modification of the exposed pattern for compensating for the proximity effect. As the electron beam elements are formed simultaneously for all of the aperture groups, the foregoing partially overlapped exposure process can be achieved with a high efficiency and throughput.

Another object of the present invention is to provide a process for exposing a pattern on an object, comprising the steps of:

producing an electron beam such that said electron beam travels toward said object along an optical axis;

shaping said electron beam according to an exposure data to form a plurality of electron beam elements aligned in a first direction and each having an identical size and shape, such that said plurality of electron beam elements form an exposure pattern corresponding to said exposure data;

scanning said electron beam elements in a second direction perpendicular to said first direction to expose said object;

said step of shaping consisting of the steps of:

(a) a step for shaping said electron beam according to first exposure data to form first electron beam elements; and (b) a step for shaping said electron beam according to second exposure data to form second electron beam elements;

said step of scanning being conducted such that said first electron beam elements scan over a first area of said object; such that said second electron beam elements scan over a second area of said object; and such that said first area overlaps with said second area;

wherein said steps (a) and (b) are conducted such that said first electron beam elements is formed with a beam density, indicative of the number of the electron beam elements radiated upon a unit area, which is substantially smaller than the beam density of said second beam elements.

According to the present invention, one can successfully compensate for the proximity effect by conducting the exposure process twice for each area of the object. Thereby, the increase of amount of information to be processed is held minimum as compared with the conventional process that repeats the multiple exposure process in more than twice. Further, the effect of defocusing of the electron beam is minimized because of the small number of electron beam elements used in the correction process. Thereby, one can conduct the compensation exposure selectively and accurately in correspondence to the part of the exposure pattern in which the dose of exposure is to be increased.

Other objects and further features of the present invention will become apparent from the following detailed description when read in conjunction with the attached drawings.

BRIEF DESCRIPTION OF THE DRAWINGS

FIGS. 5(A) and 5(B) are diagrams showing the proximity effect caused in the conventional electron beam exposure system;

FIGS. 7(A)–7(C) are diagrams showing an example of compensation for the proximity effect;

FIGS. 8(A)–8(C) are diagrams showing another example of compensation for the proximity effect;

FIGS. 9(A)–9(E) are diagrams showing a multiple exposure process achieved in the first embodiment of the present invention;

FIGS. 14(A)–14(D) are diagrams showing the modification of the exposure pattern achieved according to the third embodiment of the present invention;

FIGS. 18(A) and 18(B) are diagrams showing an example of the multiple exposure process achieved in the fifth embodiment of the present invention by using the BAA mask of FIG. 17;

DETAILED DESCRIPTION OF THE PREFERRED EMBODIMENTS

Figure 6A:
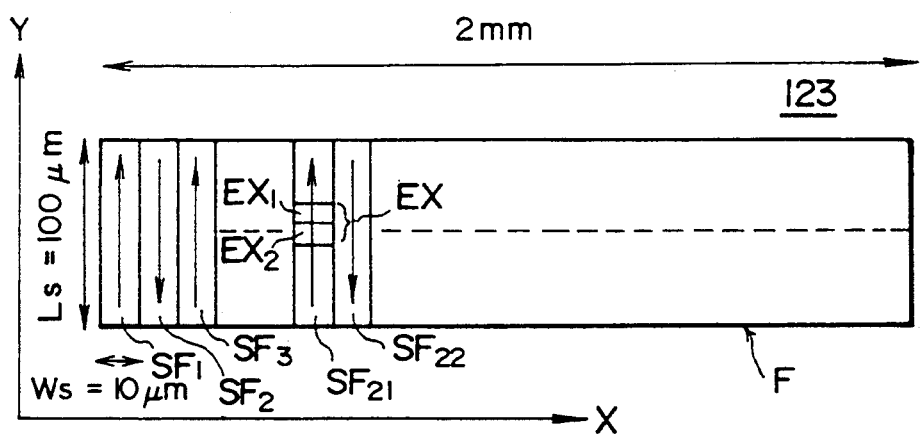
FIGS. 6(A)–6(C) are diagrams showing an exposure process according to a first embodiment of the present invention.
Figure 6B:
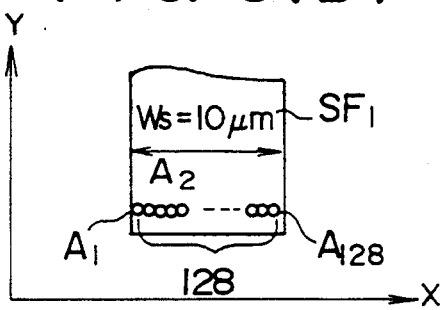
Figure 6C:
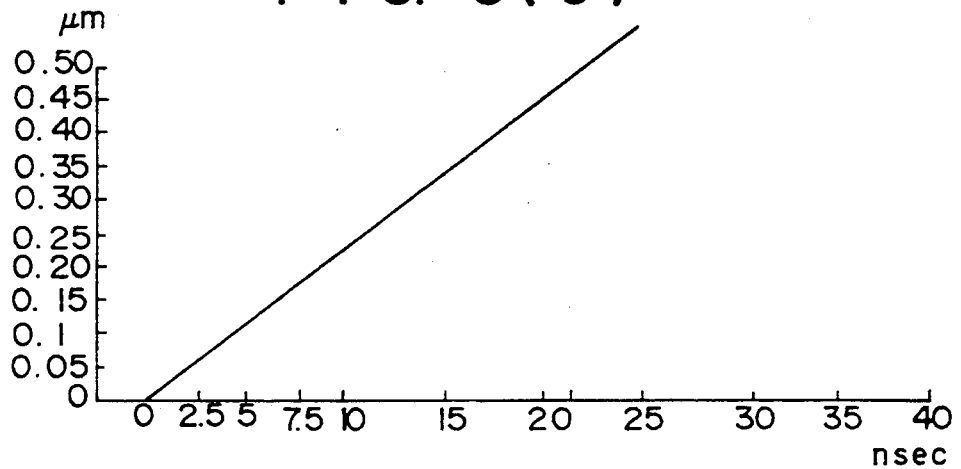
Figure 10A:
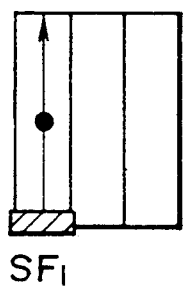
FIGS. 10(A)–10(D) are diagrams showing a multiple exposure process according to a second embodiment of the present invention.
Figure 10B:
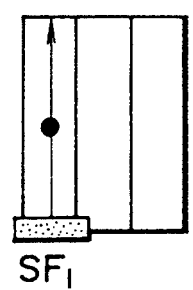
Figure 10C:
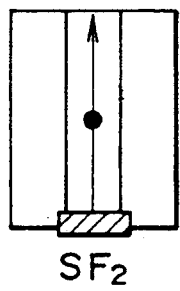
Figure 10D:
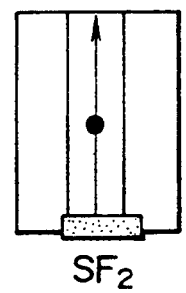

FIGS. 6(A)–6(C) show a first embodiment of the exposure process of the present invention that is conducted using the electron beam exposure system of FIG. 1 together with a BAA mask 220 to be described later. It is preferable, however, to perform the exposure process of the present embodiment by using an electron beam exposure system to be described later with reference to FIG. 20. In the following description, those parts that correspond to the parts described previously with reference to the preceding drawings are designated by the same reference numerals and the description thereof will be omitted.

Referring to FIG. 6(A), the exposure is achieved on the substrate 123 in the form of exposure stripes that are repeated in parallel relationship with each other. As shown in FIG. 6(A), each exposure stripe has a width Ws of 10 $\mu$m and extends for a length Ls of 100 $\mu$m. Thereby, the flat electron beam array is formed as indicated in FIG. 6(B), wherein it will be noted that the flat electron beam array forms a number of exposure dots $A_1$–$A_{128}$ aligned in the X-direction. The exposure dots $A_1$–$A_{128}$ correspond to the apertures such as $1A_1$–$1A_n$ represented in FIG. 2. The flat electron beam array is deflected in the Y-direction as indicated in FIG. 6(A) and the substrate 123 is exposed by the flat electron beam array as it passes in the Y-direction. It should be noted that FIG. 6(C) shows the speed of the scanning. Further, the direction of scanning is inverted, i.e., reversed, each time the flat electron beam array has reached an end of the stripe. In the actual exposure, a number of flat electron beam arrays are formed, repeating in the Y-direction in correspondence to the aperture rows 1A, 1B, 2A, 2B . . . on the BAAA mask 110.

In the present embodiment, it should be noted that the exposure is achieved in two steps in each scanning of the exposure stripe as indicated by $EX_1$ and $EX_2$ in FIG. 6(A). There, the first exposure step $EX_1$ is achieved by the aperture arrays 1A–4B of FIG. 2, while the second exposure step $EX_2$ is achieved by the aperture arrays 5A–8B of FIG. 2. Thereby, the exposure pattern is changed in the first exposure step $EX_1$ and the second exposure step $EX_2$ to achieve the compensation for the proximity effect.

FIGS. 7(A) and 7(B) show an example of the first exposure step $EX_1$ and the second exposure step $EX_2$, respectively, wherein the first exposure step $EX_1$ in FIG. 7(A) shows the primary exposure pattern while the second exposure step $EX_2$ shows the exposure pattern for compensating for the proximity effect. As will be noted, the dose of exposure is changed, in the second exposure step $EX_2$, depending upon the pattern density $\alpha$ such that the total dose becomes substantially constant, irrespective of the pattern density $\alpha$, as indicated in FIG. 7(C).

FIGS. 8(A)–8(C) show another example of the compensation for the proximity effect, wherein the exposure pattern shown in FIG. 8(B) is the primary exposure pattern while the pattern of FIG. 8(A) shows the compensation for the proximity effect. Further, FIG. 8(C) shows the total dose obtained by applying the exposure of FIG. 8(A) and FIG. 8(B). In the present example, the decrease of the dose at a marginal part of a pattern having a large pattern density is compensated by applying a dose selectively in correspondence to the marginal part of the exposure pattern.

It should be noted that the exposure process of the present embodiment is also capable of modifying the exposure pattern with a minute amount that is smaller than the size of the individual exposure dots.

FIGS. 9(A)–9(E) shows such a modification of the exposure pattern achieved as a result of such a multiple exposure process. In the drawings, the horizontal axis represents a coordinate axis set on the surface of the substrate 123 of FIG. 1 so as to extend in the direction perpendicular to the scanning direction, while the vertical axis represents the dose. Further, the threshold of exposure is represented by TH, and the hatched rectangular regions show the exposure dots that have been formed as a result of irradiation of the electron beam via the BAA mask 110. In the drawing, it should be noted that each rectangle has a size of $0.08 \times 0.08$ μm.

Figure 2:
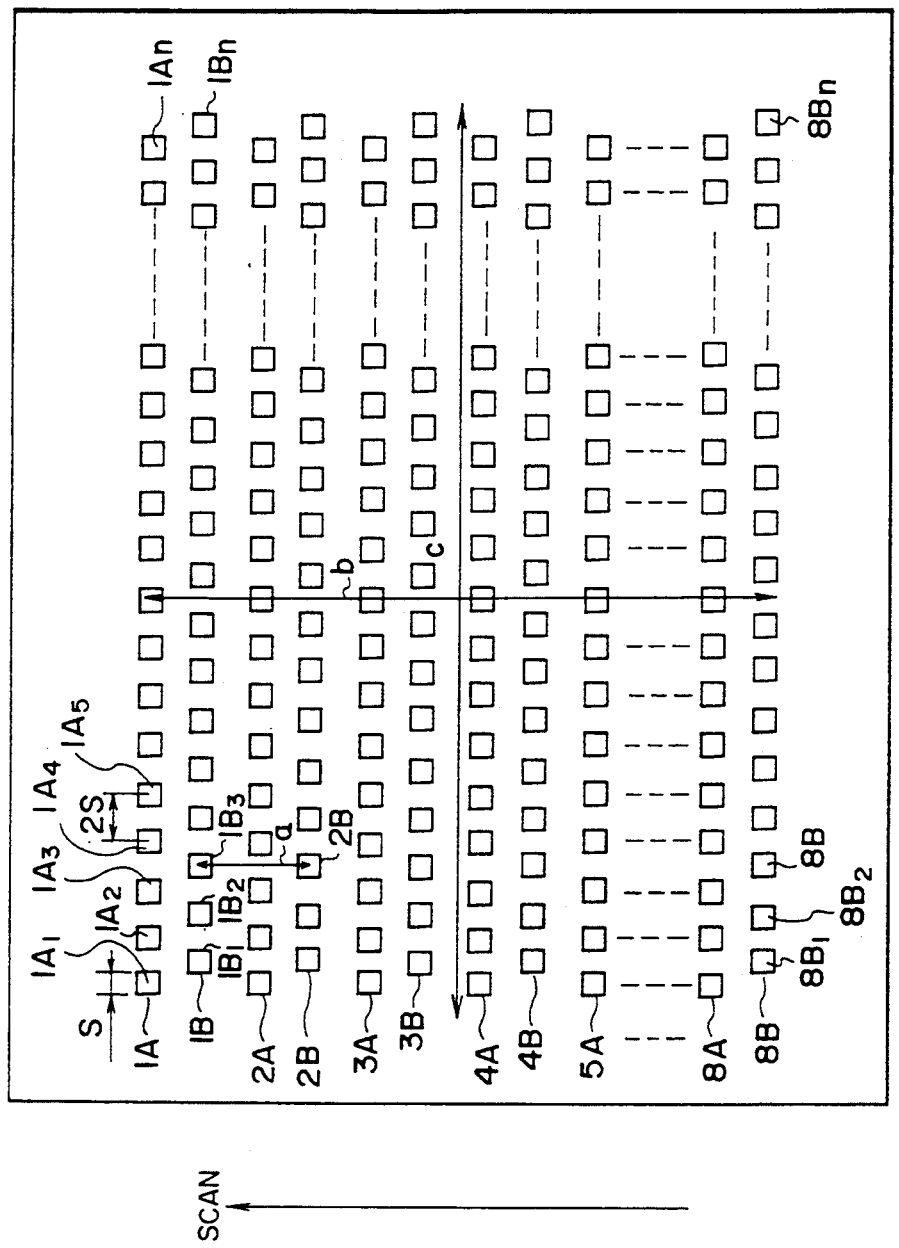
FIG. 2 is a diagram showing the BAA mask used in the electron exposure system of FIG. 1.
Figure 3:
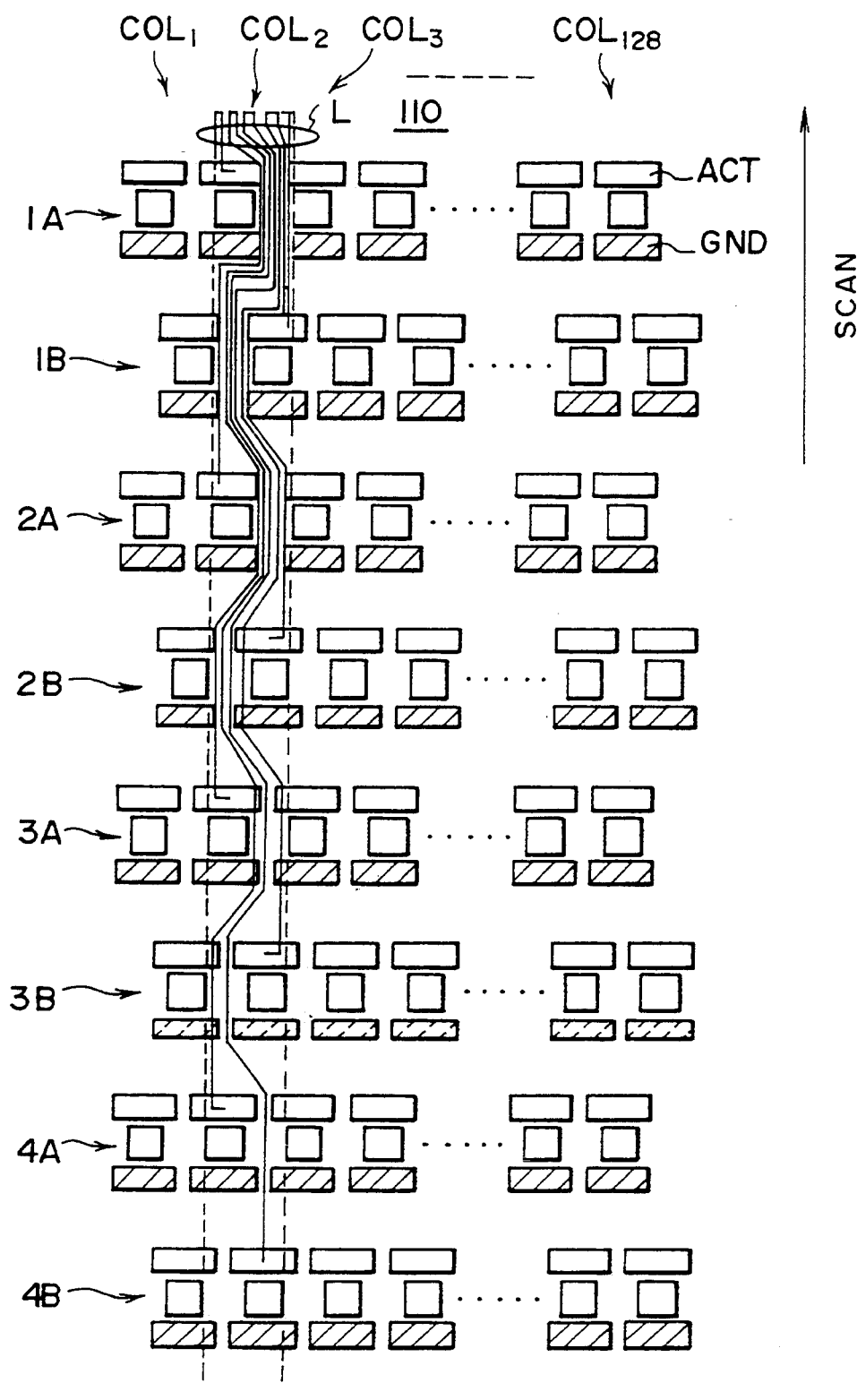
FIG. 3 is a diagram showing a part of the BAA mask of FIG. 2 in an enlarged scale.
Figure 4:
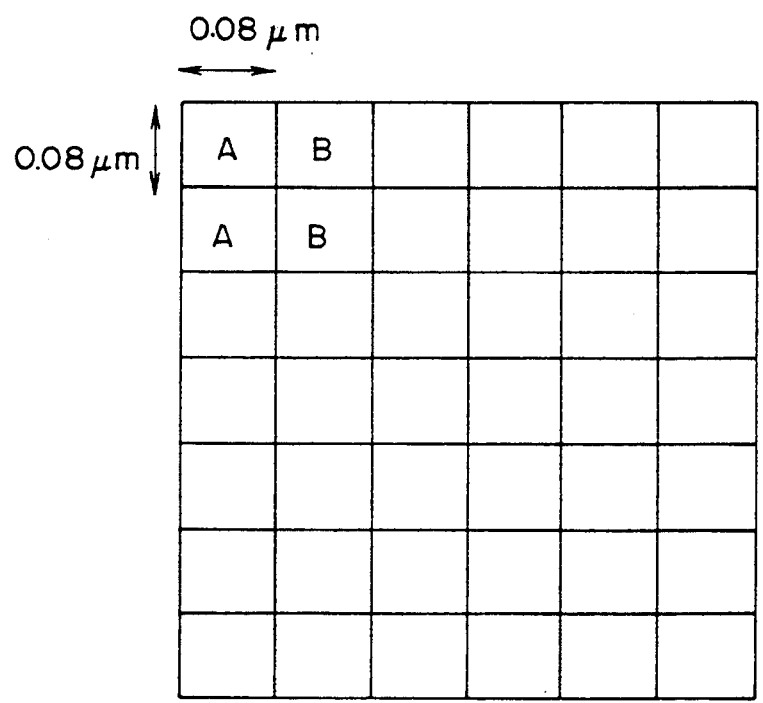
FIG. 4 is a diagram showing the exposure dots formed on a substrate by an electron beam shaped by the BAA mask of FIG. 2.

In the example of FIGS. 9(A)–9(E), it should be noted that the aperture rows 1A, 2B, 2A, 2B, ... 4A and 4B of FIG. 2 form a first group of apertures, used for the exposure step $EX_1$, and the aperture rows 5A, 5B, 6A, 6B ... 8A and 8B form a second group of apertures, used for the exposure step $EX_2$, similarly to the exposure process shown in FIG. 6(A). Further, respective, different exposure patterns are exposed in the first exposure step $EX_1$ and the second exposure step $EX_2$, such that the first and second exposure steps $EX_1$ and $EX_2$ are overlapped. In FIGS. 9(A)–9(E), the dose profile that is achieved as a result of such a double exposure process is indicated by a continuous line.

More specifically, FIG. 9(A) shows a special case wherein the same exposure pattern is used in the first exposure step $EX_1$ and the second exposure step $EX_2$ to form a pattern such that the pattern has an edge at a position $P_0$. In the illustration, the proximity effect is omitted for the sake of simplicity. Thus, there appears a sharp shoulder in the dose profile in correspondence to the position $P_0$ and the edge of the pattern is formed at the position $P_0$ with a high precision. FIG. 9(E) shows a similar case wherein the first and second exposure steps $EX_1$ and $EX_2$ are achieved to form a pattern edge at a position $P_1$ that is offset inwardly of the pattern, with respect to the position $P_0$, by a distance of 0.08 μm. In other words, the exposure pattern in FIG. 9(E) is shrunk or offset to the left with respect to the exposure pattern of FIG. 9(A). In this case, too, the edge of the pattern is determined with high precision because of the sharp shoulder in the dose profile as indicated by the continuous line in FIG. 9(E). Thus, it is obvious that one can modify the size of the exposure pattern with a step of 0.08 μm.

In the exposure process that uses the BAA mask 110, on the other hand, one can modify the size of the exposure pattern with a step that is smaller than the foregoing step of 0.08 μm. For example, FIG. 9(B) shows an exposure process, wherein the exposure step $EX_2$ prohibits the formation of the exposure dot at the position located inside the pattern with a distance of one dot with respect to the original pattern edge $P_0$. In this case, the dose profile decreases slightly at the edge part of the pattern as indicated by the continuous line in FIG. 9(B), and the pattern edge shifts slightly in the inward direction with respect to the position $P_0$ with a distance of $0.02 \pm 0.02$ μm.

FIG. 9(C) shows another such example wherein the exposure of the dot at the outermost edge of the pattern is prohibited in the exposure step $EX_2$. Thereby, the dose profile changes as indicated by the continuous line in FIG. 9(C) and the pattern edge shifts in the inward direction by a distance of $0.04 \pm 0.01$ μm. Further, FIG. 9(E) shows a case wherein the pattern edge has shifted by a distance of $0.06 \pm 0.02$ μm by prohibiting the formation of two exposure dots at the edge of the original pattern of FIG. 9(A).

Thus, by using the BAA mask 110 of FIG. 2 and using the aperture rows 1A–4B as a first group and the aperture rows 5A–8B as a second group, and by providing different drive signals to the apertures of the first group and the apertures of the second group, it is possible to modify the exposure pattern with a step of less than the size of the exposure dot. Thereby, because of the simultaneous formation of the electron beam elements for the first and second exposure steps $EX_1$ and $EX_2$, the multiple exposure process is conducted at a high speed. Of course, the multiple exposure process is not limited to the foregoing double exposure process but any number of multiple exposures may be employed by grouping the apertures on the BAA mask 110 into a number of groups corresponding to the number of the multiple exposures.

It should be noted that such a minute adjustment of the exposure pattern by means of the multiple exposure process is particularly useful for trimming the exposure pattern as in the case of compensating for the proximity effect.

FIGS. 10(A)–10(D) show a second embodiment of the present invention, wherein the exposure is achieved by repeating the same exposure path twice. Thus, in the process of FIGS. 10(A) and 10(B), an exposure stripe $SF_1$ is exposed twice, one corresponding to the exposure step $EX_1$ for exposing the primary pattern and the other corresponding to the exposure step $EX_2$ for exposing the secondary pattern. According to the present embodiment, although the throughput for the exposure is decreased as compared with the first embodiment, the requirement for the data transfer rate of the control system 200 of FIG. 1 is not so stringent as compared with the first embodiment. In this case, too, the respective doses for the first and second exposure steps $EX_1$ and $EX_2$ are set such that the total dose, including the proximity effect, exceeds the reference total dose of 200%. It should be noted that the foregoing reference total dose corresponds to the total dose for the pattern having the pattern density $\alpha$ of 100%. See FIG. 7(A). In such a pattern having the pattern density $\alpha$ of 100%, the exposure caused by the proximity effect becomes substantially identical to the exposure caused by the incident electron beam. The following list in TABLE I shows an example for the proximity effect compensation, wherein each exposure dot has a size of 0.05 μm×0.05 μm in the present case. As will be noted from the TABLE I below, the dose and hence the density of the shaped electron beam elements is set to a substantially smaller value in the secondary exposure step $EX_2$ as compared with the primary exposure step $EX_1$.

TABLE I

|  | $EX_2$ dose | Prox dose | total dose |
| --- | --- | --- | --- |
| $EX_1$ four dots (= 0.2 μm-with line), dose = 100% | | | |
| $EX_2$ three dots | 75% | 85% | 260% |
| $EX_2$ two dots | 50% | 75% | 225% R |
| $EX_1$ five dots (= 0.25 μm-with line), dose = 100% | | | |
| $EX_2$ four dots | 80% | 90% | 270% |
| $EX_2$ three dots | 60% | 80% | 240% |
| $EX_2$ two dots | 40% | 70% | 210% R, * |
| $EX_1$ six dots (= 0.3 μm-with line), dose = 100% | | | |
| $EX_2$ five dots | 83.3% | 91.6% | 274% |
| $EX_2$ four dots | 80% | 90% | 270% |
| $EX_2$ three dots | 60% | 80% | 240% |
| $EX_2$ two dots | 40% | 70% | 210% R |
| $EX_1$ six dots (= 0.35 μm-with line), dose = 100% | | | |
| $EX_2$ five dots | 71.8% | 85.9% | 257% |
| $EX_2$ four dots | 57.1% | 78.5% | 235% |
| $EX_2$ three dots | 42.8% | 71.4% | 214% R |
| $EX_2$ two dots | 28.6% | 64.3% | 192% |

R - recommended dose
* - center deviation by 0.007 μm

Next, a third embodiment of the present invention will be described.

Before starting the description of the third embodiment, the dose profile shown in FIGS. 9(A)–9(E) will be examined.

Referring to FIGS. 9(A)–9(E), it will be noted that the dose profiles shown in FIGS. 9(A) and 9(E) have a sharp shoulder and the edge of the exposure pattern is determined with a high precision. On the other hand, the dose profiles in FIGS. 9(B)–9(D) show a gentle slope as compared with the profiles in FIGS. 9(A) and 9(E). Thereby, the patterns corresponding to FIGS. 9(B)–9(D) tend to show a less well-defined pattern edge as demonstrated by the increased error band in the position of the pattern edge. This indicates that the modification of the exposure pattern, according to the double exposure process of the foregoing embodiment, tends to produce various exposure errors that change depending on the size of the exposure pattern.

FIGS. 11(A)–11(E) show the principle of the exposure process according to the third embodiment of the present invention, wherein the exposure dots exposed in the first exposure step $EX_1$ are designated as $a_1$, $a_2$ ... while the exposure dots exposed in the second exposure step $EX_2$ are designated as $b_1$, $b_2$, ... Alternatively, the exposure dots $a_1$, $a_2$, ... may be exposed in the second exposure step $EX_2$ and the exposure dots $b_1$, $b_2$, ... may be exposed in the first exposure step $EX_1$. Further, the patterns shown at the right side of FIGS. 11(A)–11(E) represent the exposure dots formed on the substrate in a plan view. Although the exposure dots are indicated to be separated from adjacent dots, this is merely a matter of convenience of illustration and the adjacent dots are formed with a partial overlap with each other as will be described below.

Referring to FIGS. 11(A)–11(E), FIG. 11(A) represents the state wherein the same pattern is exposed in the exposure steps $EX_1$ and $EX_2$ with a mutual shift by one-half a pitch of the exposure dot array in both the X- and Y-directions. In FIGS. 11(A)–11(E), those dots represented by solid circles are exposed in the first exposure step $EX_1$ to form an array in which the exposure dots are repeated in the X- and Y-directions with a predetermined pitch, while those dots represented by solid squares are exposed in the second exposure step $EX_2$ to form an array in which the exposure dots are repeated in the X- and Y-directions with the same predetermined pitch, wherein the exposure dots represented by squares are shifted, with respect to the exposure dots represented by circles, by one-half the foregoing pitch in both the X- and Y-directions. Thereby, the exposure dots represented by the squares are formed to overlap partially with the exposure dots represented by the circles.

In FIGS. 11(A)–11(E), the continuous line represents the actual dose profile achieved as a result of such a double exposure process, similarly to the illustration of FIGS. 9(A)–9(E). In FIGS. 11(A)–11(E), the variation of the exposure caused as a result of the proximity effect is omitted from illustration for the sake of simplification of the description.

Figure 11A:
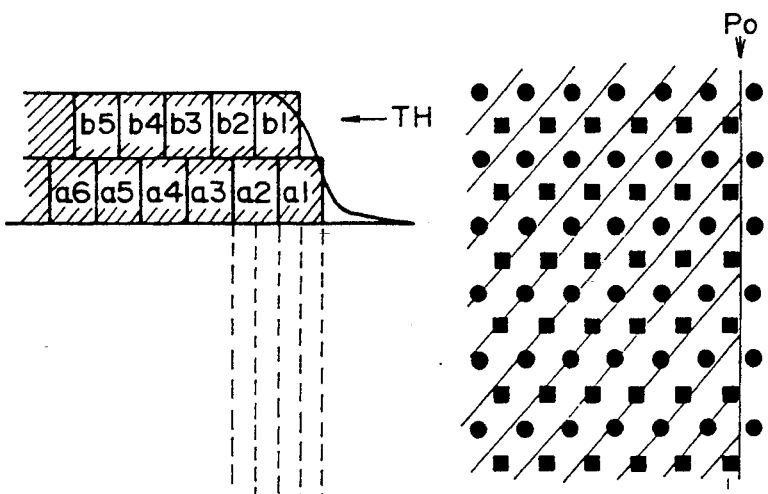
FIGS. 11(A)–11(E) are diagrams showing a multiple exposure process according to a third embodiment of the present invention.

In the situation of FIG. 11(A), it will be noted that the exposure pattern formed on the semiconductor substrate 123 has an edge at a position $P_0$ in correspondence to the threshold of exposure. It should be noted that position $P_0$ is defined as a position wherein the dose profile crosses the threshold TH of exposure.

Figure 11B:
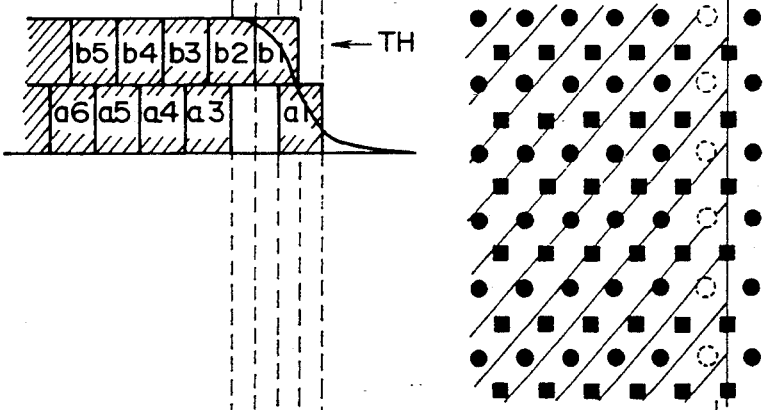

In the situation of FIG. 11(B), on the other hand, it will be noted that the exposure of the dot $a_2$ is prohibited. As a result, the dose profile shifts to the left in the direction toward the interior of the exposure pattern by a distance of about 0.02 μm. Thereby, it should be noted that the region of the substrate 123 that corresponds to the exposure dot $a_2$ is continued to be exposed by the exposure dots $b_1$ and $b_2$ that partially overlap with the foregoing exposure dot $a_2$. Further, the exposure of the dot $b_1$ that is closer to the edge $P_0$ than the dot $a_2$ is continued. As a result, the dose profile maintains a sharp shoulder even in the situation of FIG. 11(B), and the shift in the edge of the exposure pattern is minimized even when the dose has been changed with respect to the threshold TH. In the case of FIG. 11(B), the pattern edge is determined with the accuracy of ±0.01 μm.

Figure 11C:
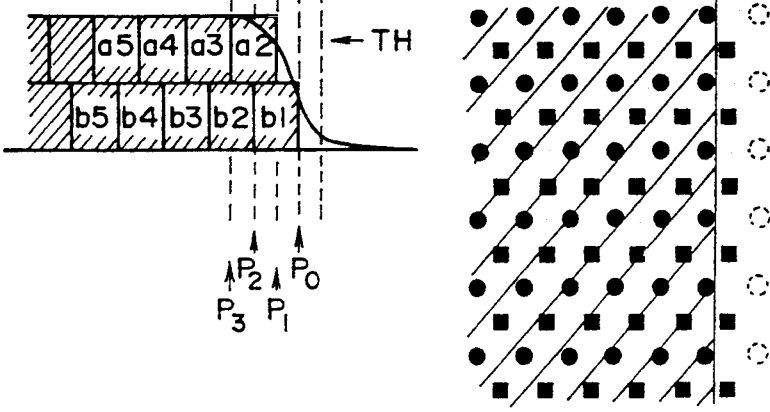

FIG. 11(C) shows the dose profile and corresponding exposure dot pattern on the substrate 123 for the case wherein the exposure of the outermost dot $a_1$ is suppressed. In the situation of FIG. 11(C), the amount of shift of the dose profile to the left direction is larger than the situation of FIG. 11(B) because of the suppression of the outermost exposure dot $a_1$, and one obtains a shift of about 0.04 μm. On the other hand, the continuous exposure of the dot $b_1$ that partially overlaps with the dot $a_1$ maintains the original shape for the dose profile, and the dose profile maintains the sharp shoulder. Thereby, the precision of exposure pattern identical with the case of FIG. 11(A) is maintained with respect to the pattern edge.

Figure 11D:
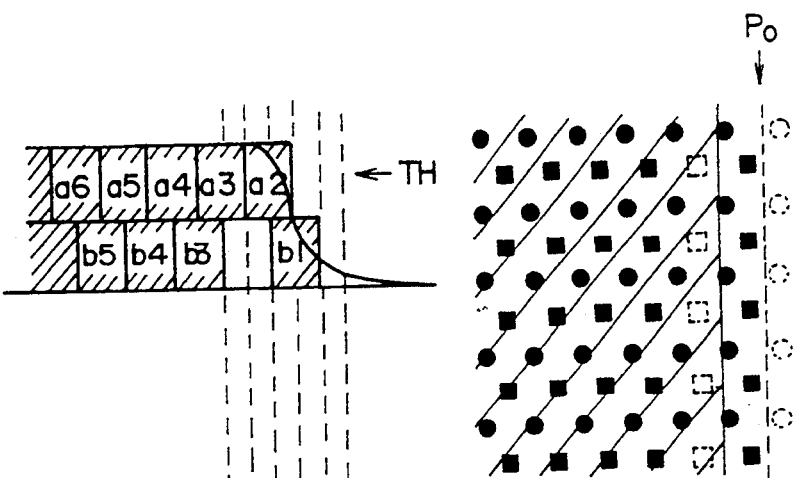

FIG. 11(D) shows the dose profile and corresponding exposure dot pattern on the substrate 123 for the case wherein the exposure of the dot $a_1$ for the first exposure step $EX_1$ and the exposure of the dot $b_2$ for the second exposure step $EX_2$ are suppressed. In this situation, the exposure profile shifts further to the left direction with respect to the situation of FIG. 11(C) by a distance of about 0.02 μm, while maintaining the original shape. Thereby, the edge of the exposure pattern is formed at a position offset inward of the exposure pattern by a distance of 0.06 μm with respect to the original edge position $P_0$. In this case, too, no substantial change occurs in the shape of the dose profile and the edge of the exposure pattern is determined with a precision of ±0.01 μm.

Figure 11E:
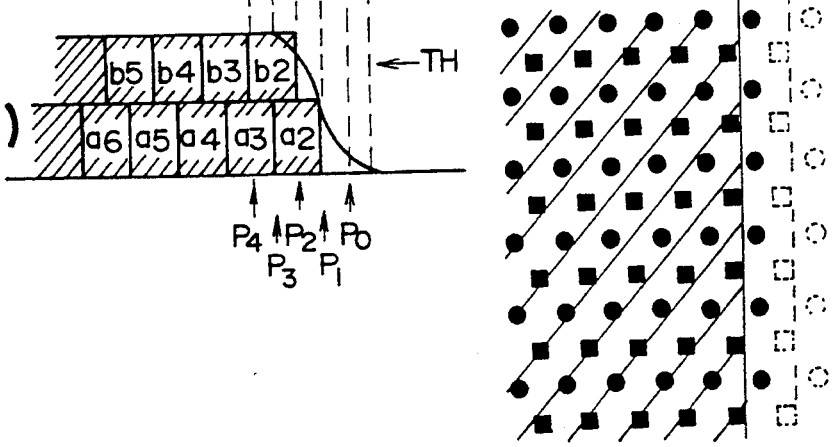

FIG. 11(E) shows a case wherein the exposure of the dot $a_1$ in the exposure step $EX_1$ and the exposure of the dot $b_1$ in the exposure step $EX_2$ are suppressed, selectively. It will be noted that the dose profile of FIG. 11(E) is completely analogous to the dose profile of FIG. 11(A) except for the displacement in the left direction by a distance of 0.08 μm.

Figure 12:
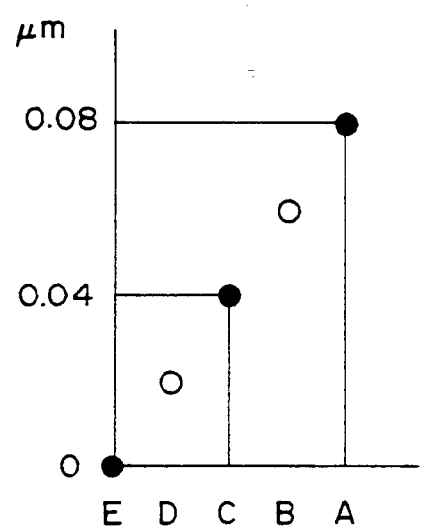
FIG. 12 is a diagram showing a modification of the exposure pattern achieved by the third embodiment of the present invention.

FIG. 12 plots the respective displacement of the edges of the exposure pattern achieved in the exposure process patterns of FIGS. 11(A)–11(E). In FIG. 12, it should be noted that the case designated as "A" corresponds to the exposure process shown in FIG. 11(A), while the case designated as "B" corresponds to the exposure process shown in FIG. 11(B). Similarly, the case designated as "C" corresponds to FIG. 11(C) while the case designated as "D" corresponds to FIG. 11(D). Further, the case designated as "E" corresponds to FIG. 11(E). As mentioned previously, the accuracy of the exposure becomes maximum in correspondence to the exposure patterns in FIGS. 11(A), 11(C) and 11(D), while the deterioration in the accuracy of exposure is minimized even in the intermediate patterns as indicated in FIGS. 11(B) and 11(D).

Figure 1:
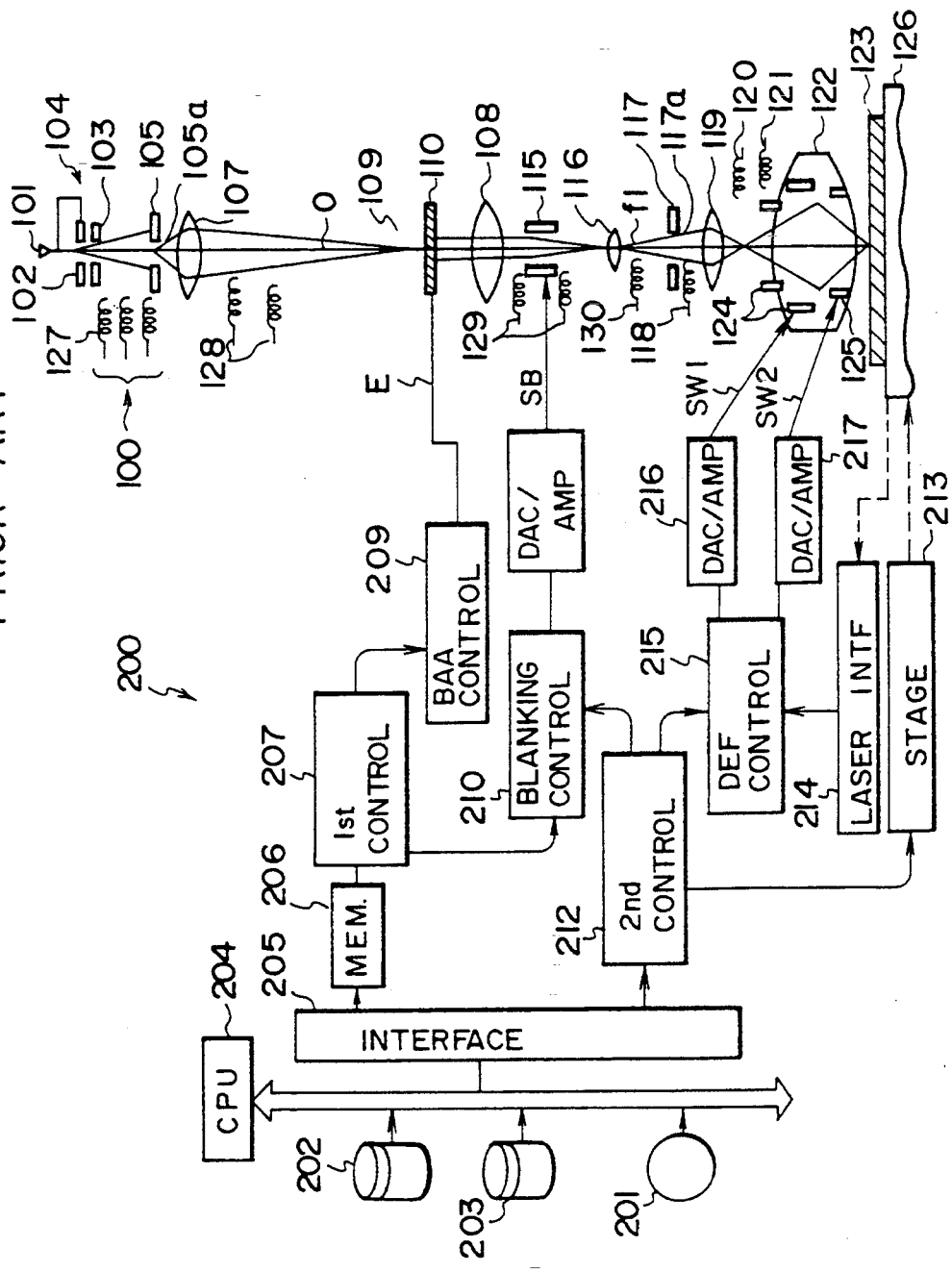
FIG. 1 is a diagram showing the general construction of a conventional electron beam exposure system.
Figure 13:
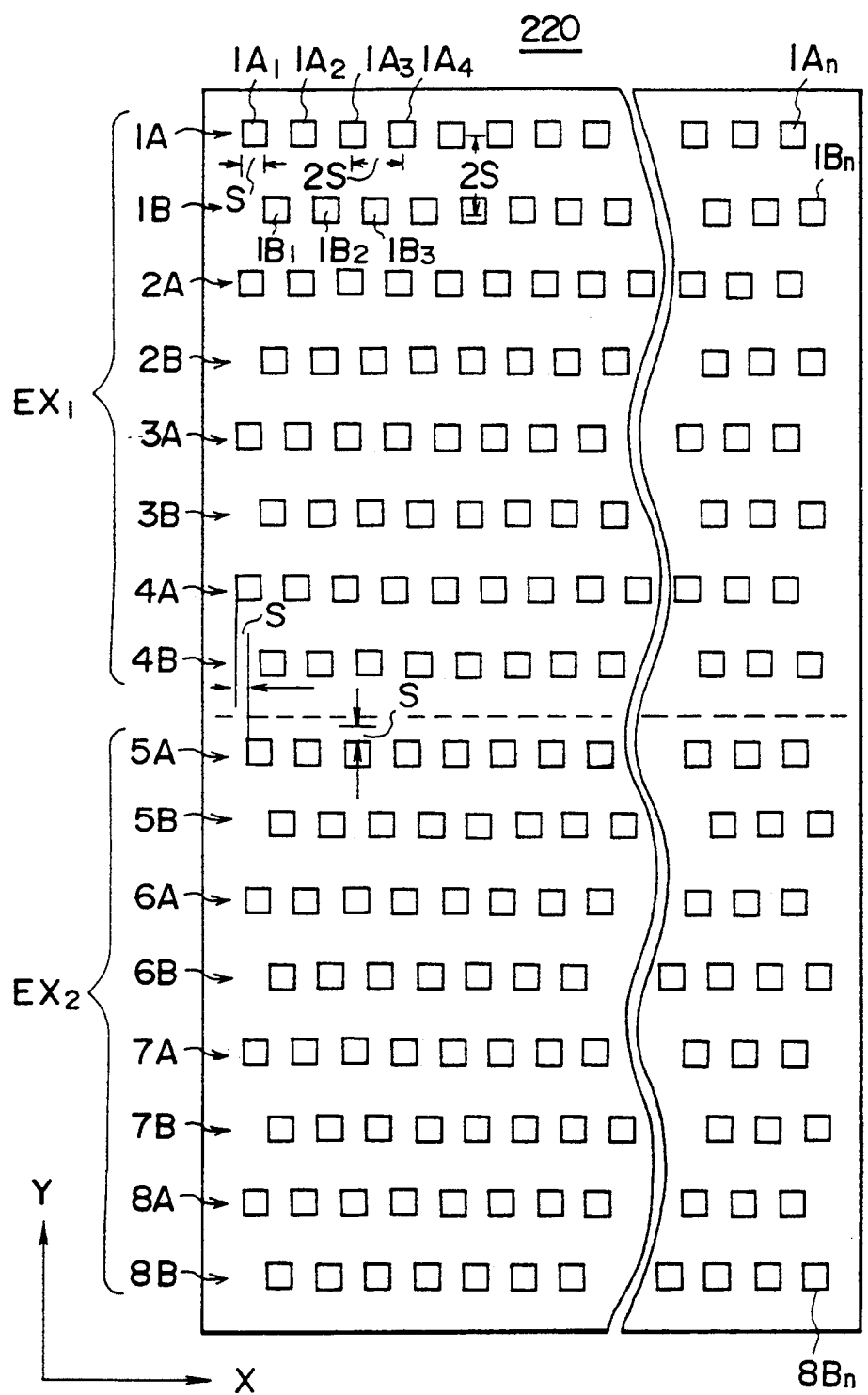
FIG. 13 is a diagram showing a BAA mask that is used for the multiple exposure process according to the third embodiment of the present invention.

FIG. 13 shows a BAA mask 220 that is used in the exposure system of FIG. 1 in place of the BAA mask 110. The mask 220 is used also in the electron beam exposure system to be described later for the purpose of achieving the exposure process patterns of FIGS. 11(A)–11(E).

Referring to FIG. 13, the mask 220 is formed with a number of apertures arranged in rows and columns at a pitch 2S such that the apertures form the aperture rows 1A, 1B, 2A, 2B ... 8A and 8B similarly to the mask 110, wherein the aperture rows 1A–4B form a first aperture group represented as $EX_1$ and the aperture rows 5A–8B form a second aperture group represented as $EX_2$, and wherein the first aperture group $EX_1$ is used for the first exposure step $EX_1$ while the second aperture group $EX_2$ is used for the second exposure step $EX_2$. It should be noted that the apertures forming the first aperture group $EX_1$ and the apertures forming the second aperture group $EX_2$ are offset from each other, at a boundary shown in FIG. 13 by a broken line, by a distance S in both each of the X- and Y-directions, and wherein the distance S corresponds to one-half the pitch 2S of the apertures on the mask 110. In correspondence to this, the mask 220 shapes the electron beam incident thereon into individual electron beam elements such that the electron beam elements formed in correspondence to the apertures of the first group $EX_1$ are offset from the electron beam elements, corresponding to the apertures of the second group $EX_2$, by a distance corresponding to the half pitch S in each of the X- and Y-directions. Of course, each of the apertures on the mask 220 is equipped with electrostatic deflectors, and the apertures forming the first group $EX_1$ and the apertures forming the second group $EX_2$ are controlled independently from each other. Thereby, one can achieve the double exposure process described with reference to FIGS. 11(A)–11(E).

In a typical example, a common drive signal is supplied to the apertures aligned in the Y-direction consecutively in each of the first and second aperture groups $EX_1$ and $EX_2$. More specifically, all the apertures on the mask 220 are driven simultaneously by respective drive signals, and the exposure dots are formed on the substrate 123 in each instance in correspondence to the entirety of the apertures on the mask 220, while feeding the drive signals consecutively in the Y-direction from one aperture row to the next aperture row with the deflection of the electron beam in the Y-direction. Thus, each region on the substrate 123 is exposed repeatedly by the electron beam elements. Thus, after the substrate 123 is exposed by the electron beam elements a plurality of times in correspondence to the apertures forming the first group rows $EX_1$, the substrate 123 is exposed with the electron beam elements corresponding to the apertures forming the second group rows $EX_2$ in a partially overlapped state. Thereby, the foregoing minute, delicate adjustment of the exposure pattern can be achieved as explained with reference to FIGS. 11(A)–11(E).

In the mask 220 of FIG. 13, it should be noted that the electron beam elements corresponding to the first group rows $EX_1$ and the electron beam elements corresponding to the second group rows $EX_2$ are formed simultaneously by shaping a common electron beam. Thereby, the first exposure step $EX_1$ and the second exposure step $EX_2$ are achieved consecutively by the electron beam elements of the first group rows $EX_1$ and the second group rows $EX_2$ similarly to the case of FIG. 6(A). Thereby, the foregoing minute, delicate adjustment of the exposure pattern can be achieved while maintaining a high exposure throughput.

FIGS. 14(A)–14(D) show an example wherein the exposure process of FIGS. 11(A)–11(E) is employed for modifying the exposure pattern. In the drawings, the exposure pattern is formed of exposure dots A and exposure dots B that are offset with respect to the exposure dots A by one-half pitch, wherein FIG. 14(A) shows the case of exposing sixteen exposure dots B arranged in four rows and four columns in superposition to twenty five exposure dots A that are arranged in five rows and five columns. In the example of FIG. 14(B), on the other hand, nine exposure dots A arranged in three rows and three columns are superposed on sixteen exposure dots B that are arranged in four rows and four columns. As a result, the exposure pattern of FIG. 14(B) is shrunk with respect to the exposure pattern of FIG. 14(A) by one pitch. In the case of FIG. 14(C), the exposure pattern is further shrunk with respect to the pattern of FIG. 14(B) by one pitch. On the other hand, FIG. 14(D) shows the case wherein the exposure dots B arranged in four rows and four columns are superposed on the exposure dots A arranged in five rows and five columns, wherein the exposure of four dots B is selectively suppressed. Thereby, it is possible to change the boundary of the exposure pattern with a step that is smaller than the pitch of the dots.

Figure 15:
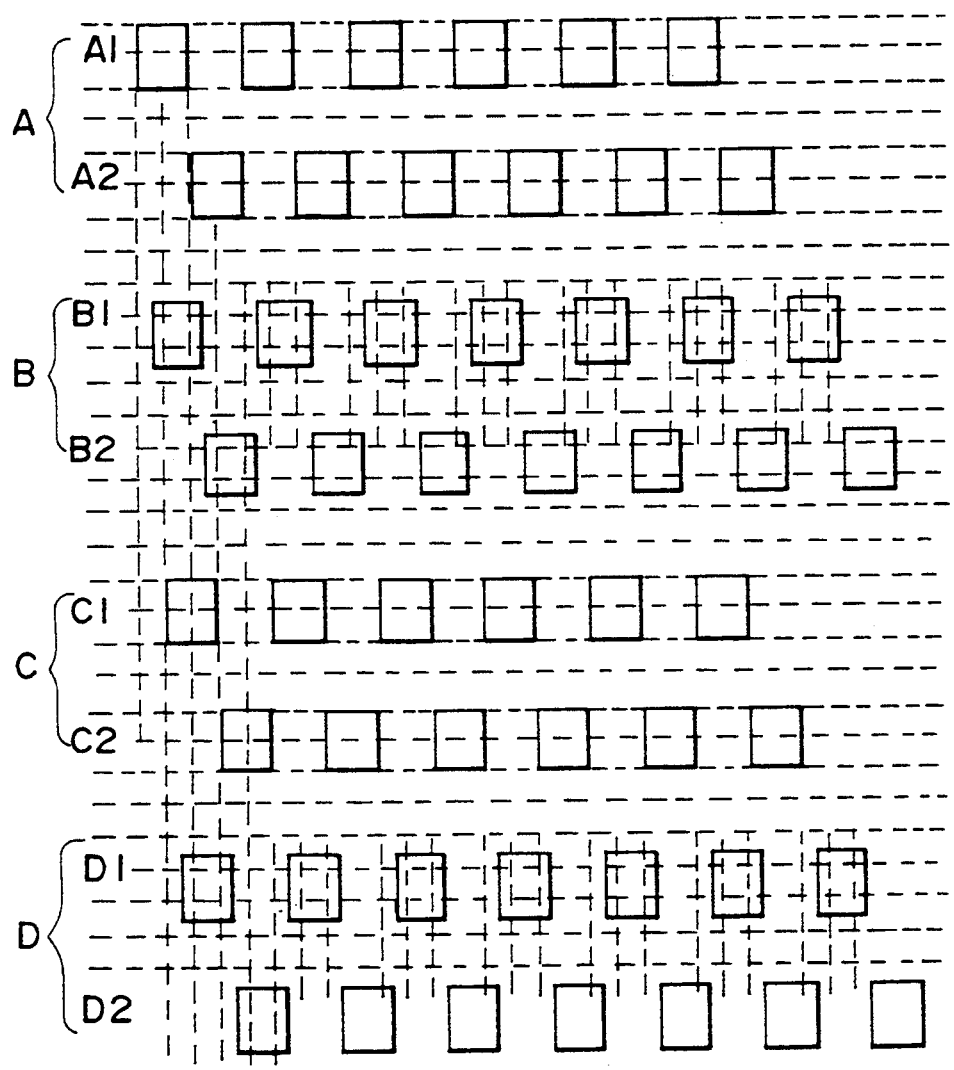
FIG. 15 is a diagram showing a BAA mask according to a fourth embodiment of the present invention.

FIG. 15 shows another BAA mask 220' according to a fourth embodiment of the present invention.

Referring to FIG. 15, the BAA mask 220' includes a plurality of aperture groups A–D, wherein each aperture group includes two rows of apertures displaced with respect to each other by one pitch. More specifically, the apertures form aperture rows $A_1$ and $A_2$, $B_1$ and $B_2$, ... Further, those apertures forming the aperture row $A_1$ are displaced with respect to the corresponding apertures forming the aperture row $B_1$ by one-quarter pitch in the X- and Y-directions. A similar relationship holds also between the apertures forming the row $A_2$ and the corresponding apertures 2 forming the row $B_2$, the apertures forming the row $B_1$ and corresponding apertures forming the row $C_1$, the apertures forming the row $B_2$ and corresponding apertures forming the row $C_2$, . . . In general, a BAA mask that includes N aperture groups is formed with the array of apertures such that apertures in one aperture group are displaced in the X- and Y-directions with respect to the corresponding apertures in the adjacent aperture group by a distance of M/N, wherein M is an arbitrary integer smaller than N.

Figure 16A:
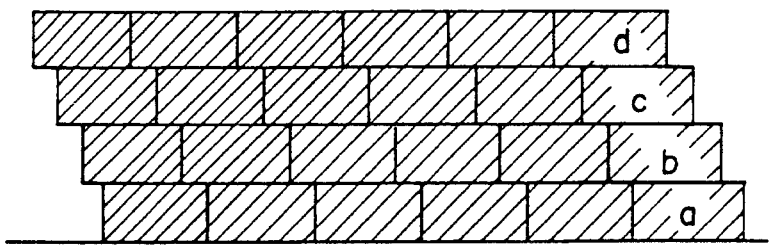
FIGS. 16(A)–16(E) are diagrams showing a multiple exposure process achieved by the BAA mask of FIG. 15.
Figure 16B:
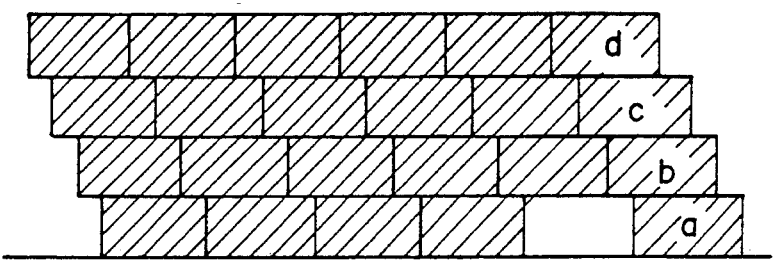
Figure 16C:
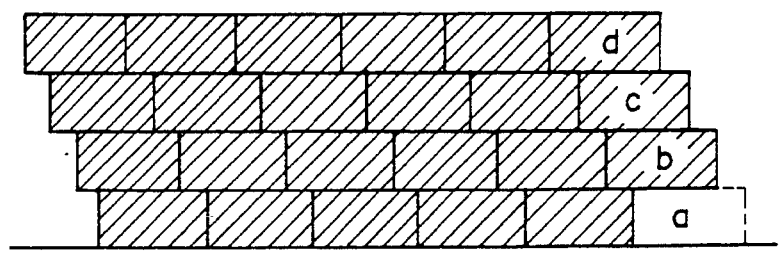
Figure 16D:
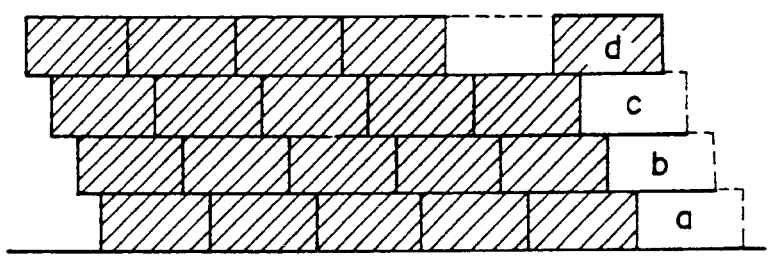
Figure 16E:
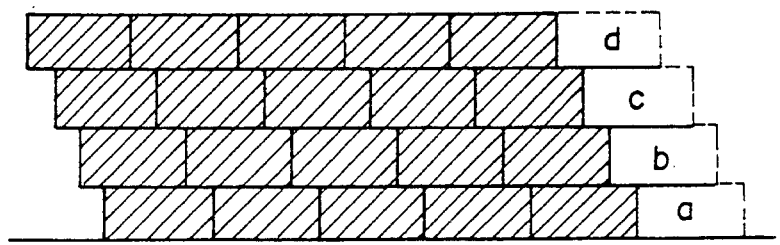

FIGS. 16(A)–16(E) are diagrams showing an example of an exposure achieved by the BAA mask 220' of FIG. 15. By prohibiting the formation of the exposure dot, selectively and as indicated, minute adjustment of the pattern edge becomes possible similarly to the case of FIGS. 11(A)–11(E). For example, the edge of the exposure pattern obtained by the exposure process of FIG. 16(B) is displaced, with respect to the edge of the pattern formed in the process of FIG. 16(A), to the left by a distance of 0.01±0.05 μm. In the example of FIG. 16(C), on the other hand, the pattern edge is displaced to the left, with respect to FIG. 16(A), by a distance of 0.02 μm. In the example of FIG. 16(C), the position of the pattern edge is determined with an accuracy identical with the case of FIG. 16(A). In the example of FIG. 16(D), on the other hand, the pattern edge is displaced to the left by 0.07±0.005 μm, while FIG. 16(E) shows a case wherein the pattern edge is displaced to the left by 0.08 μm with respect to the case of FIG. 16(A). In the example of FIG. 16(E), the pattern edge is determined with the highest accuracy similarly to the case of FIGS. 8(A) and 8(C). Further, many other combinations of the exposure patterns are possible when the BAA mask 220' is used.

Next, a BAA mask 220" according to a fifth embodiment of the present invention will be described with reference to FIG. 17.

Figure 17:
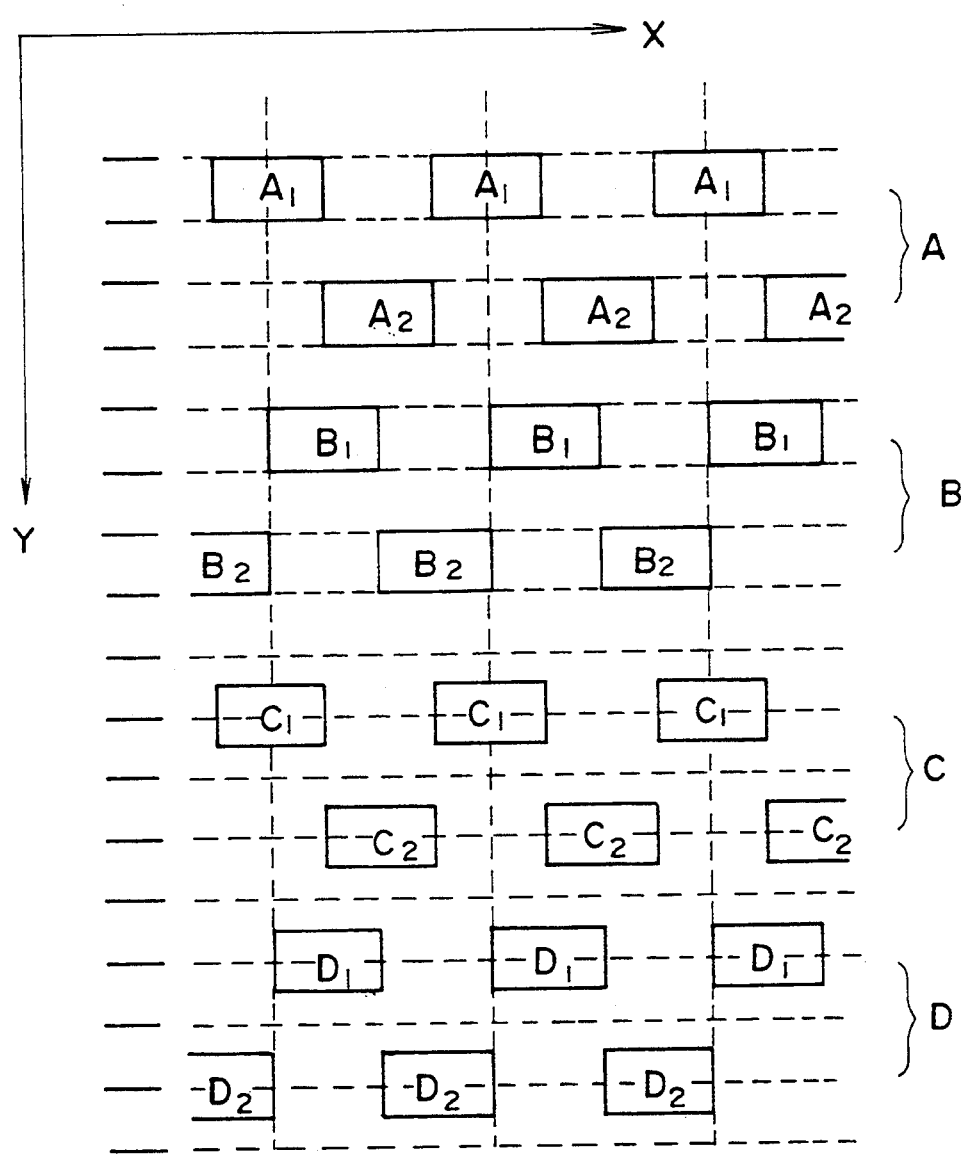
FIG. 17 is a diagram showing a BAA mask according to a fifth embodiment of the present invention.

Referring to FIG. 17, the BAA mask 220" according to the present embodiment includes a plurality of aperture groups A, B, C and D each including two rows of apertures extending in the X-direction, wherein the apertures in each group are arranged with a mutual separation of one pitch in the X- and Y-directions. For example, the aperture group A includes apertures $A_1$ and apertures $A_2$ each being aligned in the X-direction and displaced with respect to each other in each of the X- and Y-directions by a distance of one pitch. Similarly, the aperture group B includes apertures $B_1$ and apertures $B_2$ each being aligned in the X-direction and displaced with each other in the X- and Y-directions by a distance of one pitch. In addition, the apertures $B_1$ in the aperture group B are displaced, with respect to the corresponding apertures $A_1$ in the aperture group A, by one-half pitch in the X-direction. Similarly, the apertures $B_2$ in the aperture group B are displaced with respect to the corresponding apertures $A_2$ in the aperture group A by one-half pitch in the X-direction.

The aperture group C, on the other hand, includes apertures $C_1$ and $C_2$ each being aligned in the X-direction and displaced with respect to each other in the X- and Y-directions, by one pitch. The apertures $C_1$ in the aperture group C are displaced with respect to the corresponding apertures $A_1$ in the aperture group A by one-half pitch in the Y-direction. Similarly, the apertures $C_2$ in the aperture group C are displaced with respect to the corresponding apertures $A_2$ in the aperture group A by one-half pitch in the Y-direction.

Further, the aperture group D includes apertures $D_1$ and $D_2$ each being aligned in the X-direction and displaced with respect to each other in the X- and Y-directions by one pitch. The apertures $D_1$ in the aperture group D are displaced with respect to the corresponding apertures $A_1$ in the aperture group A by one-half pitch in each of the X- and Y-directions. Similarly, the apertures $D_2$ in the aperture group D are displaced with respect to the corresponding apertures $A_2$ in the aperture group A by one-half pitch in both the X- and Y-directions.

Figures 18, 18A:
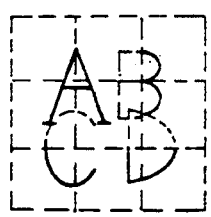

FIGS. 18(A) and 18(B) show the exposure dot pattern that is exposed on the substrate 123 by means of the BAA mask 220" of FIG. 17, wherein the exposure dots A–D represent the exposure dots formed as a result of the apertures included in the aperture groups A–D, respectively. As indicated in detail in FIG. 18(B), each of the exposure dots A–D is displaced with respect to each other by one-half pitch. Thus, by changing the exposure pattern in each aperture group A–D, one can achieve a minute modification of the exposure pattern similarly to the embodiments described heretofore. Particularly, the exposure using the mask of FIG. 17 is advantageous from the view point of eliminating the effect of the partially overlapped exposure dots aligning obliquely, as occurs in the case of using the mask of FIG. 15 wherein there is a tendency that the exposed dots tend to align, in the partially overlapped state, from the upper left direction to the lower right direction or from the upper right direction to the lower left direction. Thereby, such an appearance of orientation of the exposure dots is successfully eliminated.

Figure 19A:
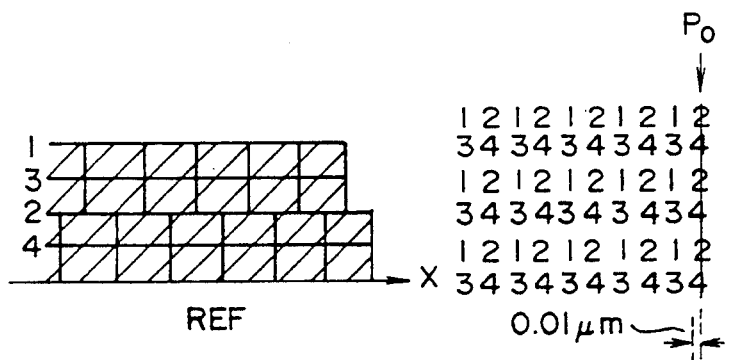
FIGS. 19(A)–19(E) are diagrams showing the multiple exposure process achieved in the fifth embodiment of the present invention by using the BAA mask of FIG. 17.

FIGS. 19(A)–19(E) show an example of the multiple exposure process using the BAA mask 220" of FIG. 17, wherein FIG. 19(A) shows the exposure of a reference pattern. In the exposure of the reference pattern, the same pattern is exposed consecutively by the aperture groups A–D. As a result, an exposure pattern having a sharp edge at the position $P_0$ is exposed as indicated in the right illustration of FIG. 11(A). It should be noted that the left illustration of FIGS. 19(A)–19(E) represents the dose achieved by the exposure, while the right illustration shows the exposure dots formed on the substrate 123.

Figure 19B:
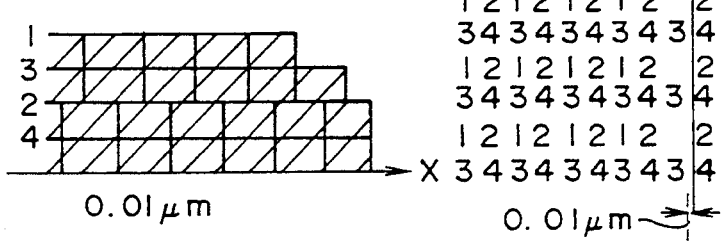
Figure 19C:
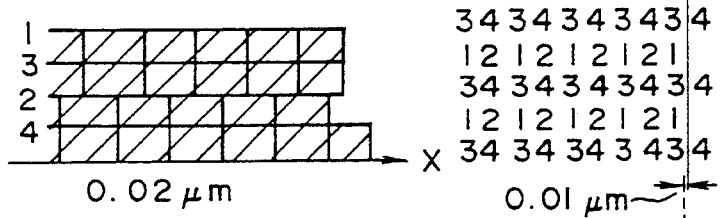
Figure 19D:
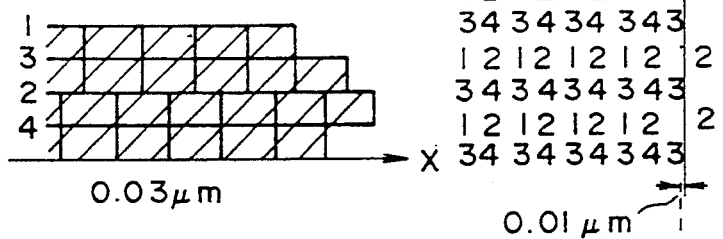
Figure 19E:
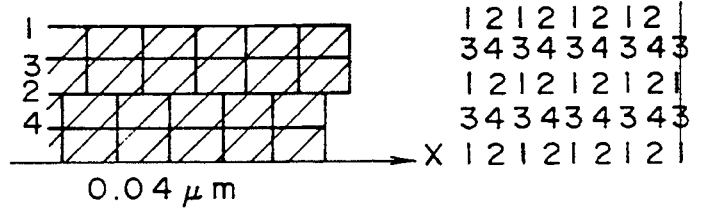

In the example of FIG. 19(B), it should be noted that the exposure pattern for the aperture group A is changed such that the formation of the exposure dot at the pattern edge is selectively suppressed. Thereby, the edge of the pattern is shifted to the right by a distance of 0.01 μm. In the example of FIG. 19(C), on the other hand, the exposure pattern for the aperture group B is changed selectively such that the formation of the exposure dot at the pattern edge is selectively suppressed for the exposure process for the group B. Thereby, the edge of the pattern is shifted to the right, further by, 0.01 μm with respect to the exposure pattern obtained by the exposure process of FIG. 19(B). In the example of FIG. 19(D), the exposure patterns for the aperture groups A and D are both changed such that the formation of the exposure dot at the edge of the pattern is selectively suppressed in the exposure processes for the aperture groups A and D. Thereby, the edge of the pattern is shifted to the right, further, by 0.01 μm with respect to the exposure process of FIG. 19(C). Further, in the exposure process of FIG. 19(E), the exposure patterns for the aperture group B and the aperture group D are both changed, and the edge of the exposure pattern is shifted to the left, further, by 0.01 μm.

As described above, the exposure process of the present embodiment is capable of controlling the pattern edge with a step smaller than the step that is achieved by the embodiment of FIGS. 11(A)–11(E). Thereby, the pattern edge is defined with high precision even in the intermediate patterns as shown in FIGS. 19(B)–19(D). Further, there are many other combinations for exposing the patterns in the present embodiment. Thus, the exposure process of the present invention described heretofore with respect to the first through fifth embodiments provides a powerful means for compensating for the proximity effect with a high exposure throughput, by conducting the exposure processes shown in FIGS. 7(A)–7(C) and in FIGS. 8(A)–8(C).

Next, the construction of an electron beam exposure system that is preferable for conducting the foregoing exposure processes will be described with reference to FIG. 20 that shows a sixth embodiment of the present invention.

Figure 20:
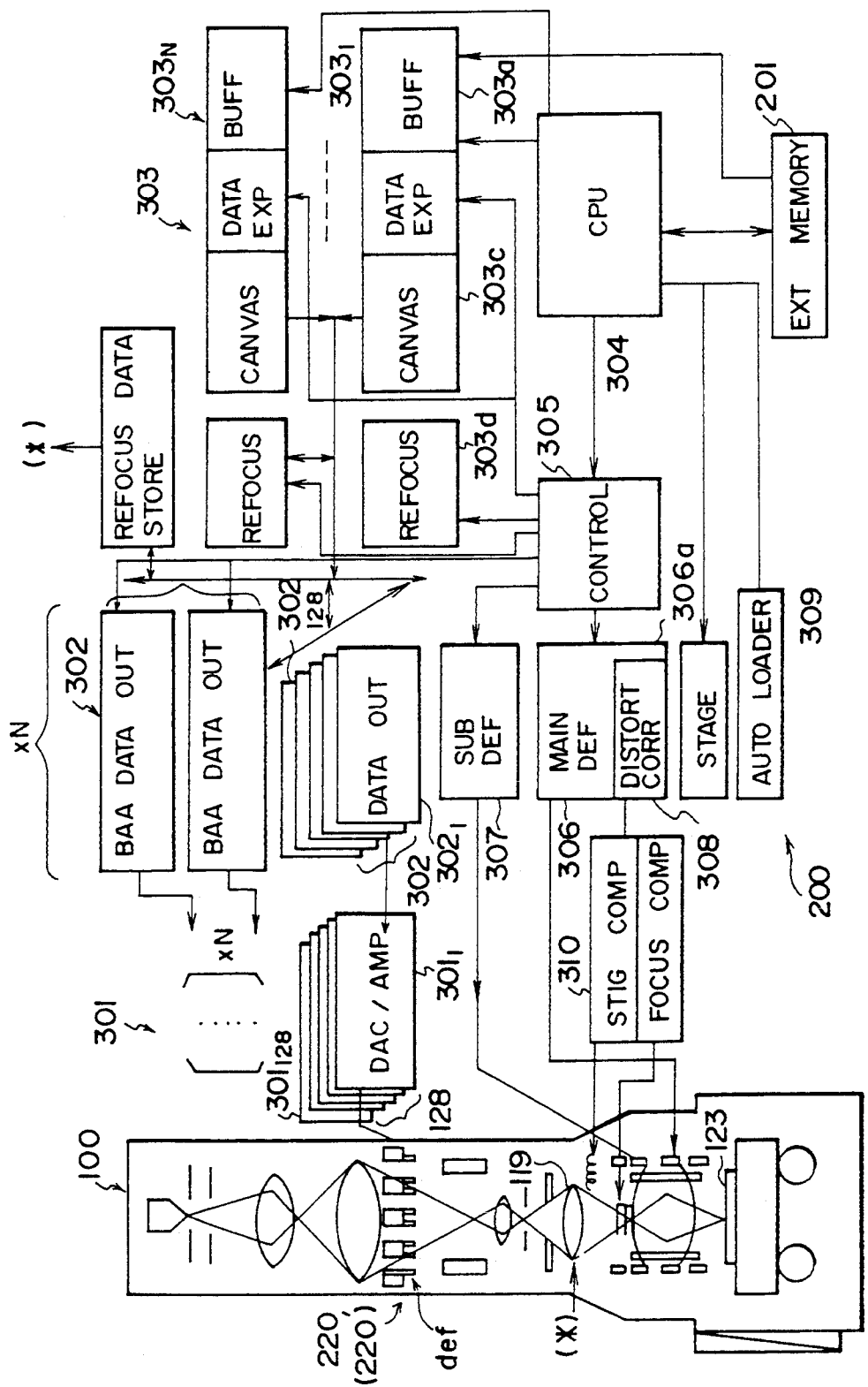
FIG. 20 is a diagram showing the construction of the electron beam exposure system according to sixth embodiment of the present invention.

Referring to FIG. 20, the electron beam exposure system uses an electron optical system similar to the electron optical system 100 of the conventional electron beam exposure system. In the first and second embodiments, the BAA mask 110 described with reference to FIG. 2 is used, while in the third through fifth embodiments, the BAA mask 220 or 220' is used. Thereby, each aperture on the BAA mask is provided with an electrostatic deflector, and the electrostatic deflector def is driven by a drive system 300 that includes a number of drive circuits $301_1$–$301_{128}$... in correspondence to the apertures on the mask. When using the BAA mask 220 of FIG. 13, wherein 128 apertures are included in each aperture row and the apertures form two aperture groups that are offset from each other by one-half pitch, for the shaping of the electron beam, it is necessary to provide 128×2 drive circuits in the drive system 300 for driving the apertures on the BAA mask. When the BAA mask 220' or the BAA mask of FIG. 17 is used wherein the apertures are arranged to form N groups that are offset from each other by M/N pitches, on the other hand, it is necessary to provide 128×N drive circuits $301_1$–$301_{128}$, ... $301_1^N$–$301_{128}^N$, in the drive system 300, wherein each of the drive circuit $301_1$–$301_N$, ... includes a D/A converter and a corresponding analog amplifier.

In correspondence to the drive circuits $301_1$–$301_{128}$, ... $301_1^N$–$301_{128}^N$, a BAA data storage and output unit 302 is provided, wherein the unit 302 includes BAA data generators $302_1$–$302_{128}$ ... $302_1^N$–$302_{128}^N$. Thereby, each of the BAA data generators $302_1$–$302_{128}$ ... is supplied with exposure data from a data expansion unit 303 via a bus. The data expansion unit 303 includes N data processing units $303_1$–$303_N$ in correspondence to the N aperture groups on the BAA mask, wherein each of the data processing units such as the unit $303_1$ includes a buffer memory 303a that is supplied, either via a CPU 304 or directly, with exposure data from the external storage device 201 of FIG. 1, a data expansion circuit 303b supplied with the exposure data from the buffer memory 303a for expanding the same to form the exposure pattern in correspondence to each of the aperture rows on the BAA mask, and a canvas memory 303c for storing the expanded exposure data in the form of bit map data. The construction of the data expansion circuit 303b will be described later in detail. Further, the data expansion unit 303 includes a refocusing control circuit 303d for compensating for the defocusing of electron beam elements on the substrate as a result of the Coulomb interaction between the electron beam elements. The refocusing control circuit 303d controls the intensity of the electron lens 119 based upon the pattern density as represented by the number of the exposure dots formed on a unit area in a unit time, such that the electron beam elements are properly focused upon the substrate 123 irrespective of the pattern density. More specifically, when the number of exposure dots exposed in the unit area increases, the control unit 303d increases the intensity of the electron lens 119 to decrease the focal length of the lens 119. Thereby, the increase of the apparent focal length of the lens 119, caused by the Coulomb interaction between the electrons forming the electron beam, is successfully eliminated. When the number of the exposure dots decreases, on the other hand, the control unit 303d decreases the strength of the lens 119.

The CPU 304 controls an exposure control unit 305, and the exposure control unit 305 controls a main deflector driver circuit 306 and a sub-deflector driver circuit 307 that correspond to the deflection circuit 215 of FIG. 1. Thereby the driver circuits 306 and 307 cooperate with main and sub-deflectors 124 and 125 respectively and energize the same to cause a deflection of the electron beam on the substrate 123. It should be noted that the drive circuit 306 includes a distortion compensating circuit 306a that achieves compensation of various aberrations such as defocusing and astigmatism via a correction circuit 310. Further, the CPU 304 controls a stage driver 308 and an automatic loading/unloading mechanism 309.

Figure 21:
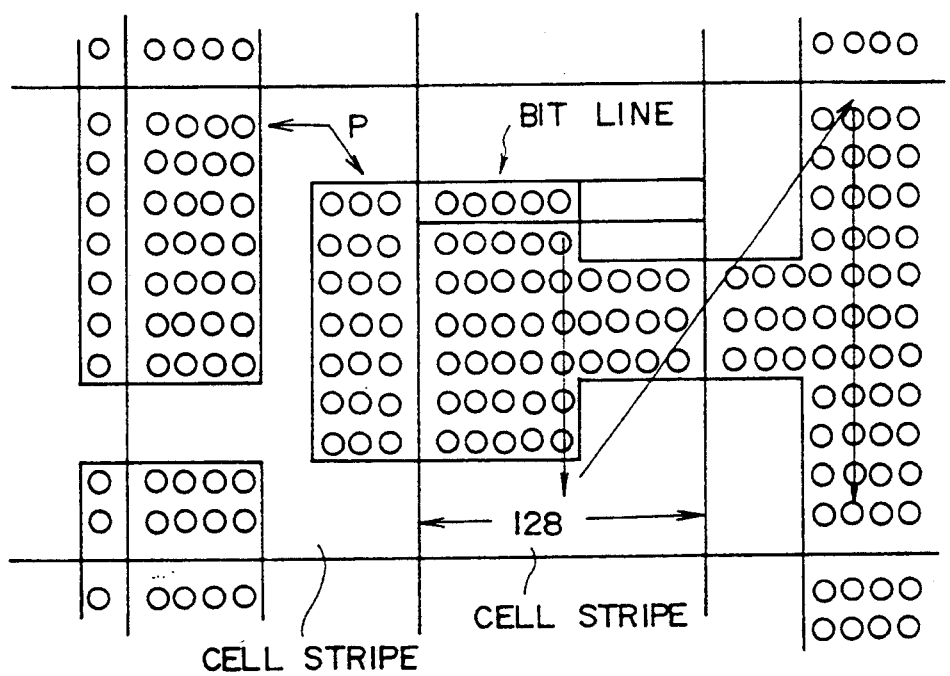
FIG. 21 is a diagram showing an example of the exposure pattern formed on the substrate by the electron beam exposure system of FIG. 20.

FIG. 21 shows an example of the exposure pattern that is supplied from the CPU 304 to the buffer memory 303a of the data expansion unit 303.

Referring to FIG. 21, the open circles represent the exposure dot and an exposure pattern P is formed as an assembly of the exposure dots. As shown in FIG. 21, the exposure pattern P is divided into a number of cell stripes extending vertically in the drawing, while each cell stripe is formed as an assembly of bit lines formed of 128 exposure dots aligned in the lateral direction. In the typical example, the cell stripe has a size of about 100 μm in the longitudinal direction and a size of 5–10 μm in the lateral direction.

Figure 22:
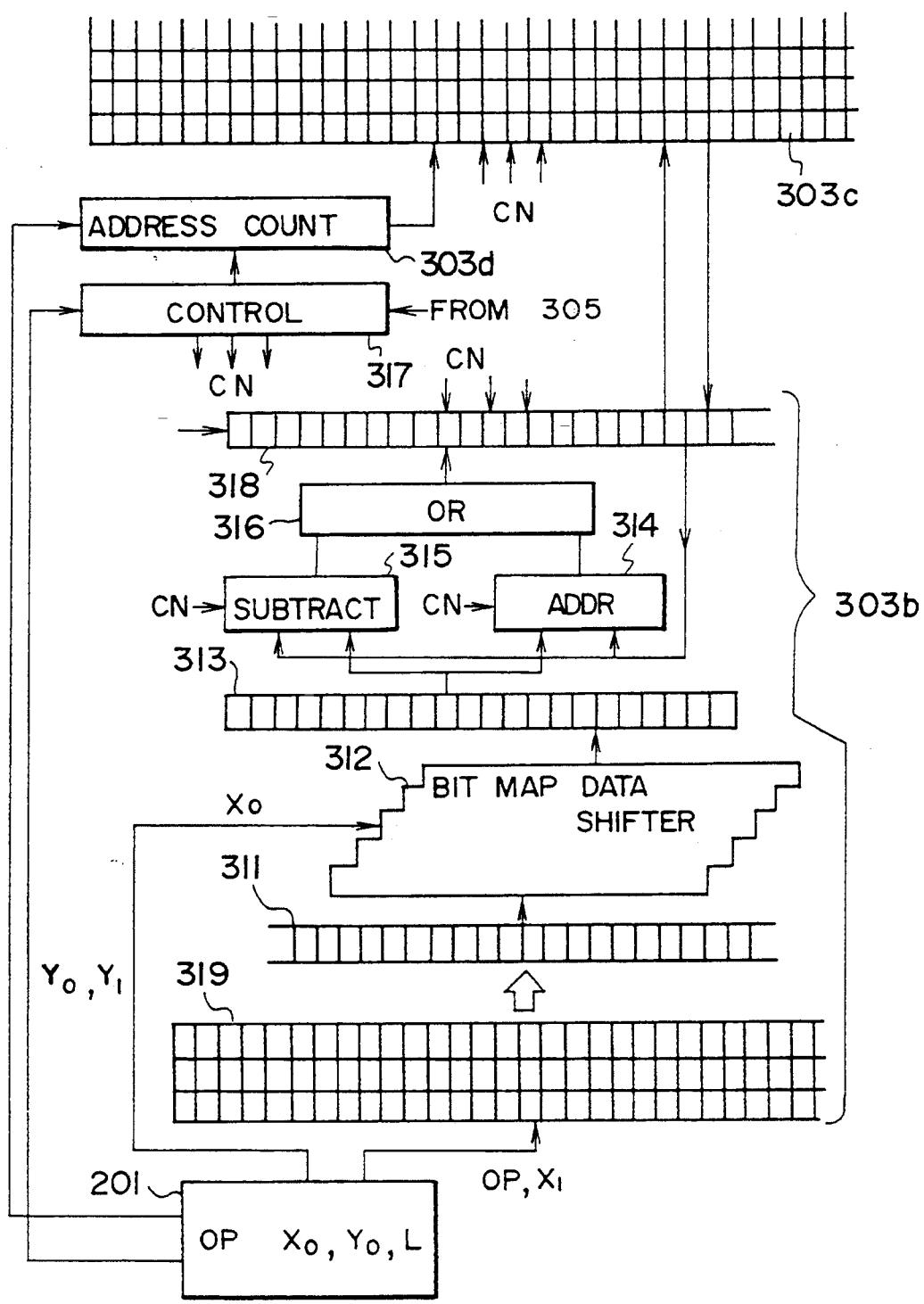
FIG. 22 is a diagram showing a part of the electron beam exposure system of FIG. 20 in detail.

FIG. 22 shows the construction of the data processing unit $303_1$. Other data processing units forming the data expansion unit 303 have substantially the same construction.

Referring to FIG. 22, the exposure data supplied from external storage devices includes shape data OP for designating the shape of the exposure pattern, origin data $X_0$ and $Y_0$ for representing the origin of the exposure pattern respectively with respect to the X-axis and the Y-axis, and size data $X_1$ and $Y_1$ respectively representing the size of the exposure data in the X-direction and Y-direction. The shape data OP is supplied directly to a control unit 317 in the data expansion unit and further to a block pattern library 319, while the origin data $Y_0$ is supplied to an address counter 303d forming a part of the data expansion unit. In addition, the origin data $X_0$ is supplied to a bit map data shifter 312, while the size data $X_1$ is supplied to the block pattern library 319.

The block pattern library 319 outputs a bit map corresponding to a bit line having a size specified by the size data $X_1$ and supplies the same to the bit map data shifter 312 via a register 311, wherein the origin of the bit line is set based upon the origin data $X_0$. The bit line thus formed in the bit map shifter 312 is held in an output register 313.

The bit map data for the bit line held in the output register 313 is supplied to an adder 314 and a subtracter 315 wherein addition or subtraction of the bit map is achieved with respect to a corresponding bit line already stored in the canvas memory 303c in the form of bit map. The selection of the adder 314 or subtracter 315 is achieved by the control unit 317 based upon the shape data OP. Depending on the shape data OP, there may be a case wherein no subtraction or addition is achieved with respect to the pre-existing bit map data. The bit map of the bit line thus processed is then supplied to an OR circuit 316 and supplied further to the canvas memory 303c via a write register 318, wherein the bit line is stored in the canvas memory 303c at an address that is specified by the address counter 303d. Thereby, the address counter 303d specifies an address that starts from the origin data $Y_0$. The specified address is represented as $Y_0+\Delta Y$ wherein $\Delta Y$ is smaller than $Y_1$ ($\Delta Y < Y_1$).

In the present invention, N data expansion units $303_1$–$303_N$ each having the construction of FIG. 22 are provided as indicated in FIG. 20, in correspondence to the N aperture groups on the BAA mask, and the multiple exposure process described previously becomes possible. Thereby, one can achieve the compensation of proximity effect or minute modification of the exposure pattern with a high throughput. It should be noted that the exposure control system of FIG. 20 is applicable also to the BAA mask 110 of FIG. 2 when the apertures on the mask 110 are driven in N, different aperture groups.

Figure 23:
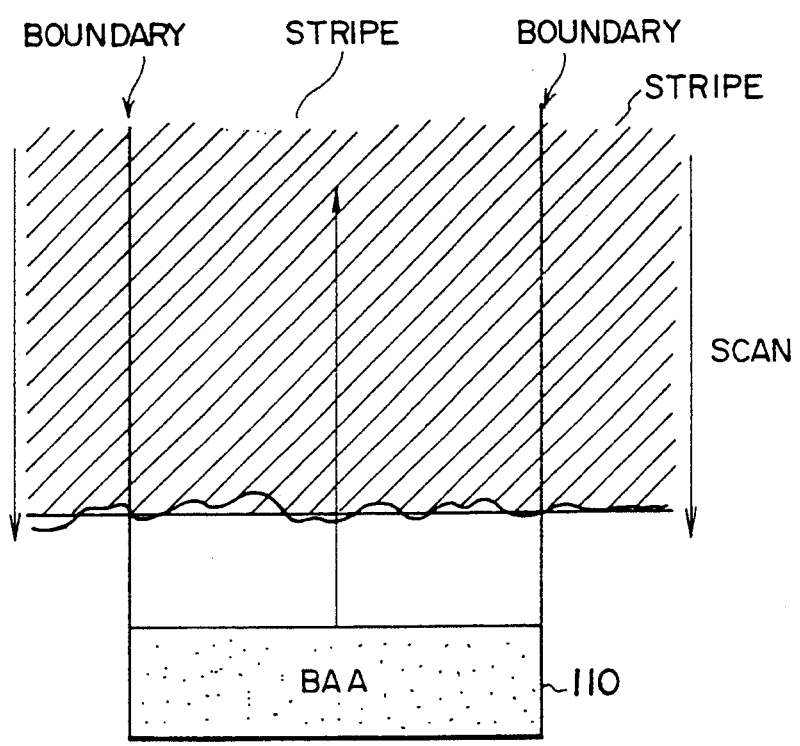
FIG. 23 is a diagram showing a problem that occurs in the electron exposure system of FIG. 20 when achieving an exposure of a pattern with an extremely high resolution.

When applying the foregoing minute adjustment of the exposure pattern by using particularly the BAA mask 220, 220′ or 220″ that carries thereon staggered aperture groups, there sometimes occurs a case wherein the timing the energization of the apertures on the BAA mask is important. In such a case, one has to consider the lag in the timing of the energization of the apertures on the BAA mask. As can be seen in FIG. 20, different aperture groups on the BAA mask are energized by different drive circuits $301_1$–$301_{128}$ and the difference in the length of electric wiring from the drive circuit to the aperture causes an offset in the timing of energization of the apertures on the BAA mask. When such a lag in the timing exists, there occurs a case wherein the edge of the exposure pattern is undulated as indicated in FIG. 23. Further, there may be a discrepancy in the exposure pattern at a boundary between one cell stripe and adjacent cell stripe. Generally, such an undulation is extremely small. On the other hand, when one attempts to adjust the pattern size with such an accuracy that can be achieved by the present invention, such a minute undulation can become a substantial problem.

Figure 24:
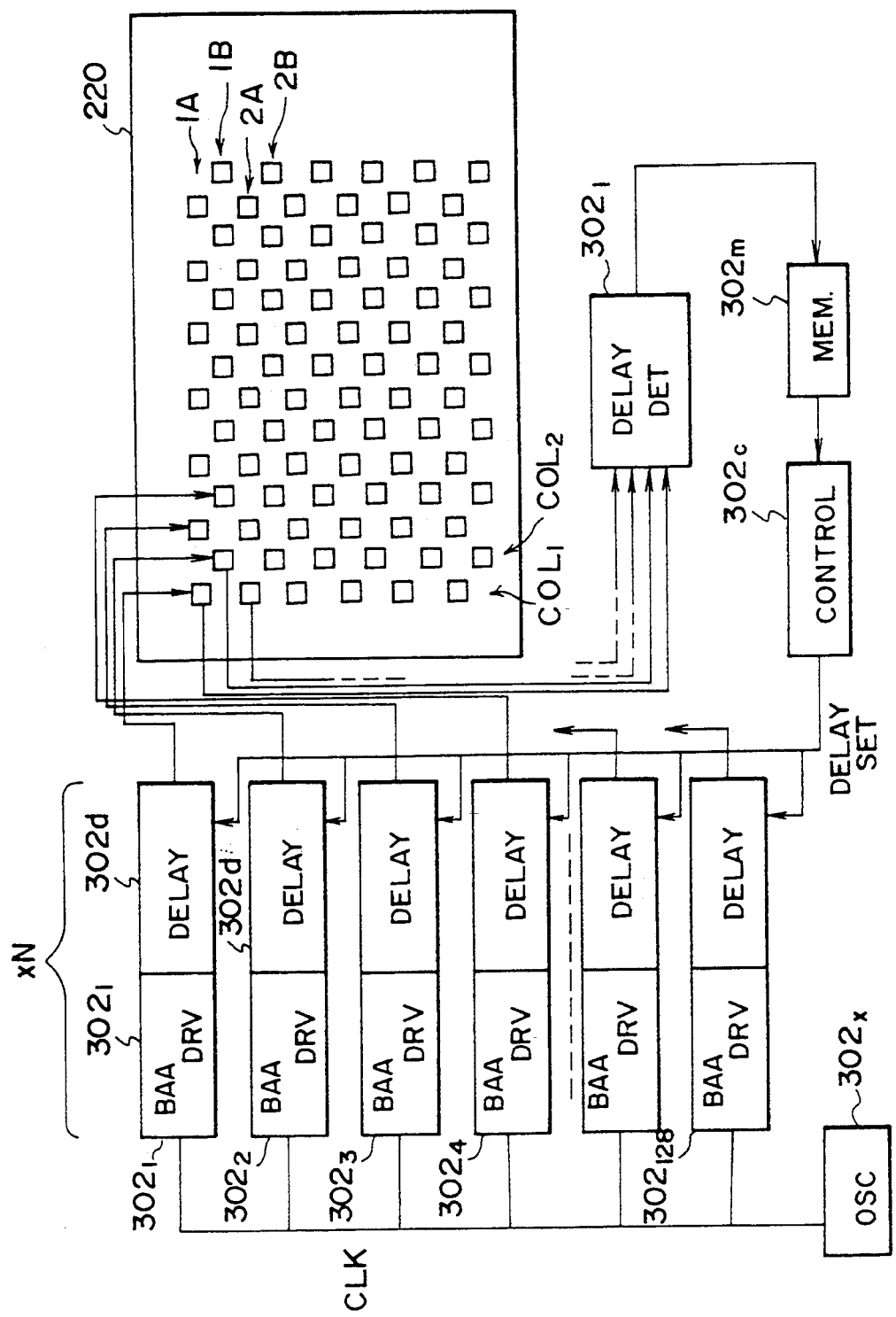
FIG. 24 is a diagram showing a part of the electron beam exposure system of FIG. 20 according seventh embodiment of the present invention in detail.

FIG. 24 shows a seventh embodiment of the present invention for eliminating the forgoing problem of undulation of the exposure edge.

Referring to FIG. 24, the N×128 BAA data generators such as $302_1$–$302_{128}$ are driven in response to a clock that is supplied from an oscillator 302x, and there is provided a delay circuit 302d in correspondence to each of the BAA data generators. The delay circuit 302d is controlled in response to an output of a control circuit 302c, while the control circuit 302c cooperates with a memory 302m to cause a delay in the output of the BAA data generator according to the delay data stored in the memory 302m in correspondence to each of the apertures on the BAA mask such as the mask 220. Since the present invention activates the apertures on the BAA mask in N aperture groups, the BAA data generators are provided also in N groups and, in correspondence to this, the delay circuit 302d is provided also in N groups.

It should be noted that the clock skew in the circuits $302_1$–$302_{128}$ due to the difference in the length of wiring is in the order of several picosecond and hence can be ignorable. On the other hand, the length of the wiring connecting the BAA data generators $302_1$–$302_N$ to the BAA mask can vary, depending upon the assembling state of the system, in the range of 1 m. In such a case there can appear a delay in the magnitude of 10 nanoseconds in the exposure timing of the exposure dots. The foregoing argument holds also in the case wherein the D/A converter 301 is provided between the BAA data generator 301 and the BAA mask such as 220.

In operation, the control circuit 302c controls the individual delay circuits 302d such that the drive signals output from the corresponding BAA data generators $302_1$–$302_{128}$ are supplied to the corresponding apertures on the BAA mask without additional delay. Next, the timing of the drive signal on the BAA mask is detected by a delay detection circuit 302f, wherein the circuit 302f produces an output signal indicative of the delay of the drive signal, and the delay thus detected is stored in the memory 302m. Next, the foregoing control circuit 302c reads out the timing of the drive signals from the memory 302m, and calculates a relative delay with respect to the signal that has the largest delay. The relative delay thus calculated is stored in the memory 302m. When conducting the exposure process, the control circuit 302c reads out the relative delay from the memory 302m and controls each of the delay circuits 302d such that the timing of the drive signals is coincident with the timing of the drive signal that has the largest delay.

Figure 25:
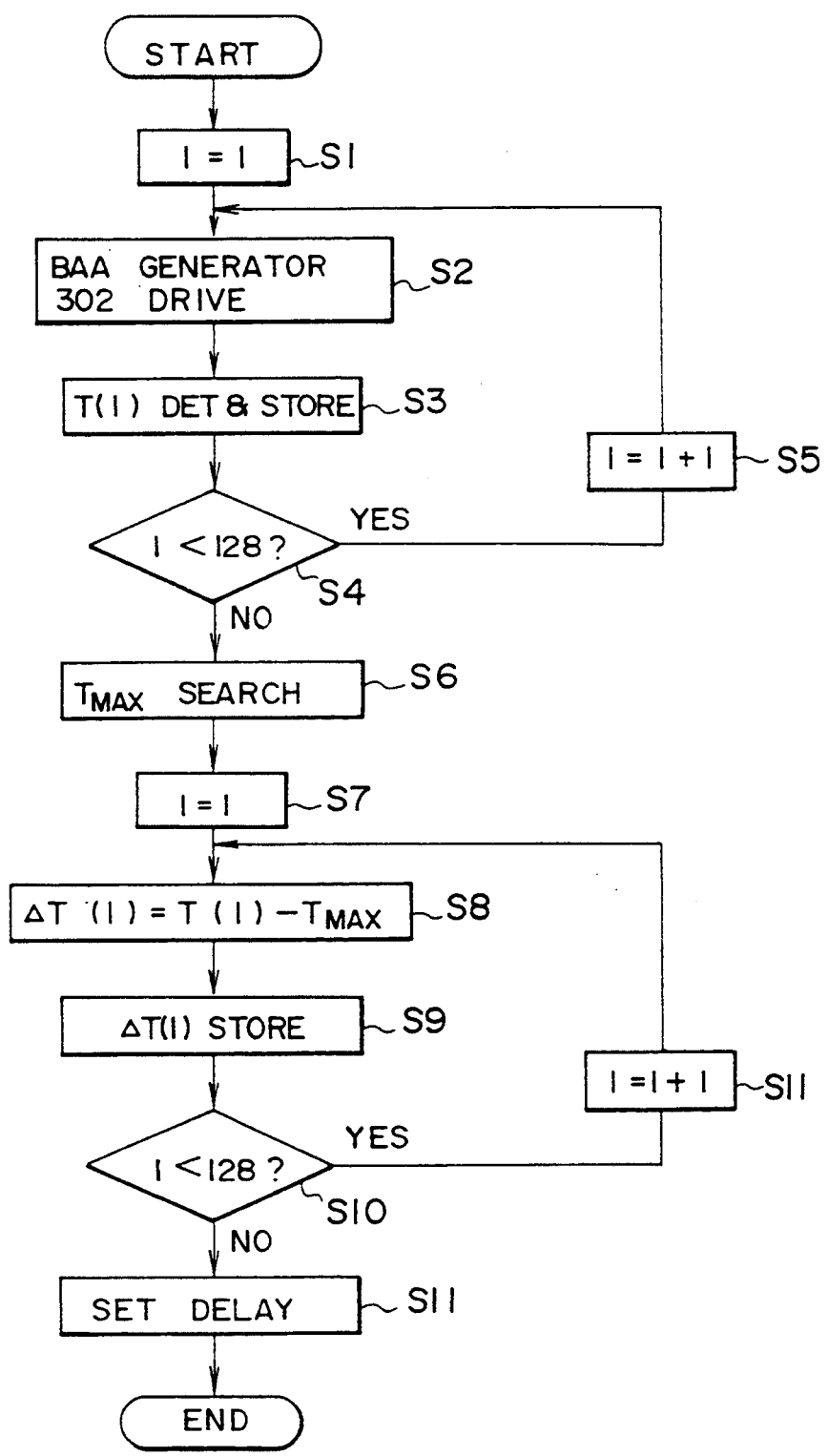
FIG. 25 is a flowchart of operations conducted in the electron beams exposure system of FIG. 24.

FIG. 25 shows a flowchart corresponding to the foregoing operation.

Referring to FIG. 25, a step S1 is conducted at first to initialize a parameter I to 1, and a step S2 is conducted subsequently wherein one of the BAA data generators 302i, such as $302_1$, is activated. Further, a step S3 is conducted wherein a timing Ti of the drive signal is detected by the delay detection circuit 302f for those apertures that are energized simultaneously by the BAA data generator 302i. The timing Ti thus obtained is stored in the memory 302m. Further, by conducting steps S4 and S5, the foregoing processes are conducted for each of the circuits $302_1$–$3023_{128}$.

Next, in a step S6, the timing $T_{MAX}$ that shows the largest delay is searched for, from the timing data Ti stored in the memory 302m. Further, in a step S7, the parameter I is initialized to 1 once more, and a step S8 is conducted to calculate the relative delay $\Delta Ti$ with reference to the delay $T_{MAX}$. Further, each delay $\Delta Ti$ thus calculated is stored in the memory 302m in step S9. Further, by conducting the steps S10 and S11, the relative delay $\Delta T_i$ is stored in the memory 302m in correspondence to each of the BAA data generators $302_1$–$302_{128}$, ... Finally, in a step S11, the delays caused by the delay circuits 302d are set such that the timing of the drive signals from the circuits $302_1$–$302_{128}$, ... are coincident with each other at the BAA mask.

Figure 26:
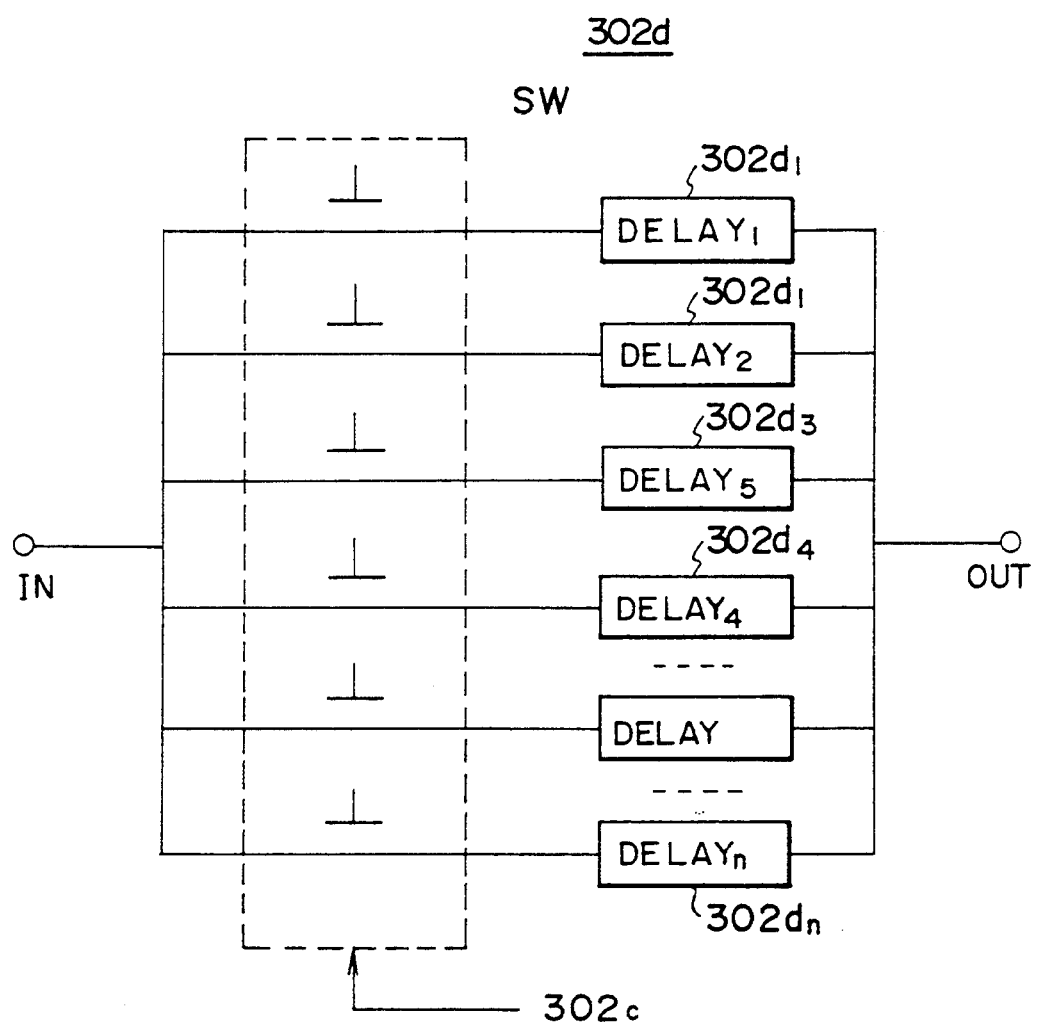
FIG. 26 is a diagram showing a part of the electron beam exposure system of FIG. 24 in detail.

FIG. 26 shows an example of the delay circuit 302d used in the circuit of FIG. 24.

Referring to FIG. 26, the delay circuit 302d includes a number of delay elements $301d_1$–$302d_n$ that have different amount of delay, and there is provided a switch SW for selecting one of the delay elements in response to the output of the control circuit 302c. Generally, each of the delay elements $302d_1$–$302d_n$ provides a delay of several tens of nanoseconds in the maximum.

Figure 27:
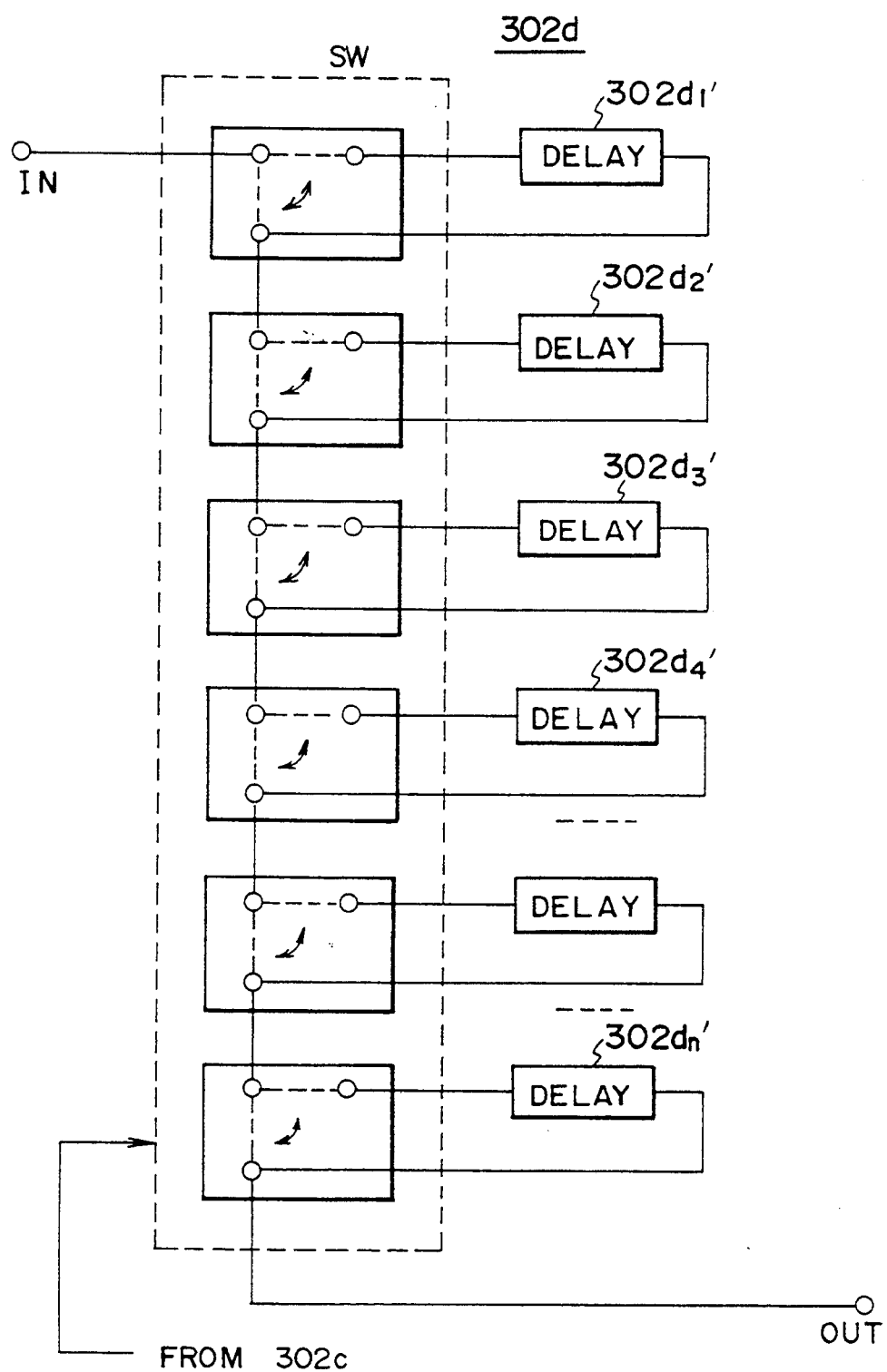
FIG. 27 is another diagram showing a part of the electron beam exposure system of FIG. 24 in detail.

FIG. 27 shows another example of the delay circuit $302d$ used in the circuit of FIG. 24.

Referring to FIG. 27, the delay circuit $302d$ includes 5 delay elements $302d_1'$–$302d_n'$ having respective delays and a switch SW', wherein the switch SW' connects selected delay elements in series based upon the control signal from the control circuit $302c$. As the construction and function of the circuit $302d$ is obvious from FIG. 21, further description will be omitted.

Figure 28:
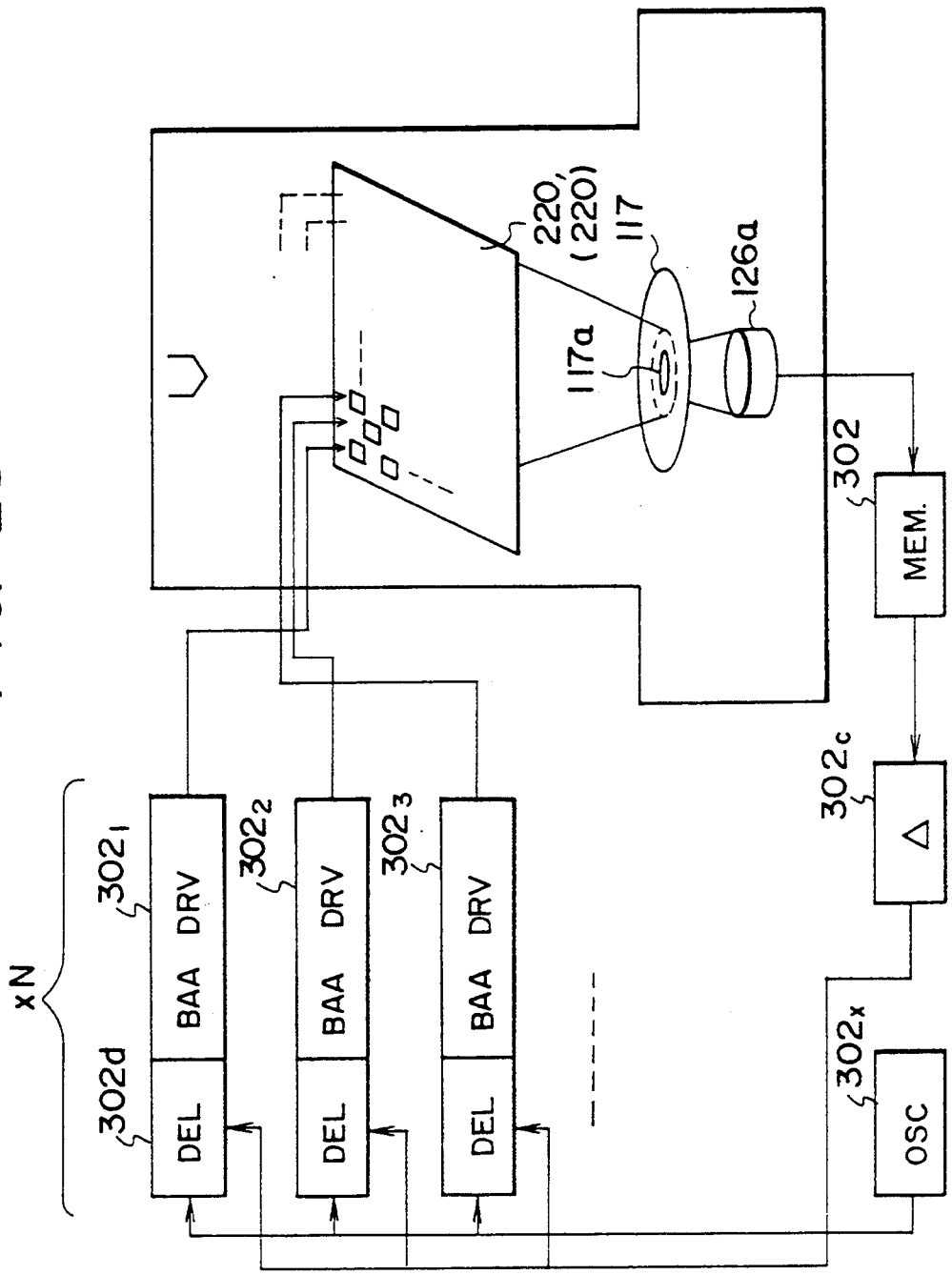
FIG. 28 is a diagram showing a part of the electron beam exposure system of FIG. 20 according to an eighth embodiment of the present invention.

Next, an eighth embodiment of the present invention will be described with reference to FIG. 28, which embodiment also eliminates the problem of lag in the timing of the drive signal of the BAA mask. In FIG. 28, those parts described previously, with reference to the preceding drawings are designated by the same reference numeral and the description thereof will be omitted.

Referring to FIG. 28, the present embodiment employs a high speed electron detector $126a$, such as a multi-channel plate in place of the delay detection circuit $302f$, for detecting the delay in the energization of the apertures on the BAA mask. Thereby, the detector $126a$ is carried on the stage 126 and detects the arrival of the electron beam elements that have passed through the apertures on the electron beam mask in response to the drive signal from the BAA data generators $302_1$–$302_{128}$... The electron detector $126a$ produces a pulse signal in response to incoming of the electron beam and supplies the output pulse to the memory $302m$. Thereby, the BAA data generators $302_1$–$302_{128}$... are activated consecutively, and the memory $302m$ stores the timing of arrival of the electron beam in correspondence to each of the BAA data generators. The control circuit $302c$ thereby reads out the timing of arrival of the electron beam elements from the memory $302m$ as the timing of the drive signals of the BAA array and calculates the relative delay of the drive signals with respect to the drive signal having the maximum delay, for each of the BAA data generators. The relative delay thus calculated is stored into the memory $302m$ again. In operation, the control circuit $302c$ reads out the relative delay from the memory $302m$ and controls the timing of the clock supplied to the BAA data generators. The foregoing operation is substantially identical with the operation described previously with respect to the flowchart of FIG. 25. In the present embodiment, the timing of turning on and turning off of the electron beam elements on the substrate is detected directly, and a reliable control of the exposure process is possible.

Further, the present invention is not limited to the embodiments described heretofore, but various variations and modifications may be made without departing from the scope of the invention.

What is claimed is:

1. A method for exposing a pattern on an object by means of an electron beam, comprising the steps of:
   producing an electron beam such that said electron beam travels toward said object;
   shaping said electron beam to produce a plurality of electron beam elements of a common size and shape and forming an electron beam pattern;
   exposing said electron beam pattern on said object in the form of an array of exposure dots arranged with a predetermined pitch, by radiating said electron beam elements on said object;
   said step of shaping being conducted so as to produce said plurality of electron beam elements in the form of a first group of beam elements and a second group of beam elements, simultaneously and such that said first group of beam elements forms a first electron beam pattern and said second group of beam elements forms a second, different electron beam pattern; and
   said step of exposing being conducted as a first sub-step and a second sub-step such that, in said first sub-step, said first electron beam pattern is exposed on an exposure field defined on said object, and such that, in said second sub-step said second electron beam pattern is exposed on said same exposure field defined on said object.

2. A method as claimed in claim 1, wherein one of said first and second electron beam patterns has a first pattern density, indicative of the number of the exposure dots formed on a unit area of the object, and the other of said first and second electron beam patterns has a second pattern density which is substantially smaller than said first pattern density.

3. A method as claimed in claim 2, wherein said respective first and second pattern densities are set such that a total dose, defined as a sum of a first dose, produced by said first electron beam pattern, and a second dose, produced by said second electron beam pattern, becomes substantially constant in each of plural said exposure patterns exposed on said object.

4. A method as claimed in claim 1, wherein one of said first and second electron beam patterns includes an edge pattern, corresponding to an edge of a pattern included in the other of said first and second beam patterns.

5. A method for exposing a pattern on an object by means of an electron beam, comprising the steps of:
   shaping a single electron beam to form a plurality of electron beam elements respectively of a common size and shape and extending generally in parallel with respect to each other and forming an electron beam pattern;
   radiating said plurality of electron beam elements on said object thereby to expose said pattern on said object as an assembly of corresponding exposure dots arranged with a predetermined pitch;
   said step of shaping the electron beam being conducted so as to produce said plurality of electron beam elements, simultaneously, as a plurality of electron beam element groups, each group including plural and respectively associated said electron beam elements extending in parallel with respect to each other and aligned in a first direction, and such that said electron beam elements aligned in said first direction are repeated in a second direction perpendicular to said first direction, said step of shaping the electron beam being further conducted So as to produce said electron beams of said plurality of electron beam groups simultaneously; and
   forming each of said electron beam elements included in one of said electron beam groups, with respect to corresponding electron beam elements in the other electron beam groups, with an offset of said predetermined pitch multiplied by M/N in at least one of said first and second directions, wherein N stands for the number of the electron beam groups and M represents an arbitrary integer smaller than N.

6. A method as claimed in claim 5, wherein said step of shaping is conducted so as to form said electron beam elements such that each of said electron beam elements of one electron beam group is offset from a corresponding electron beam element of the other electron beam group in said first direction by said predetermined pitch multiplied by M/N.

7. A method as claimed in claim 5, wherein said step of shaping is conducted so as to form said electron beam elements such that each of said electron beam elements of one electron beam group is offset from a corresponding electron beam element of the other electron beam group in said second direction by said predetermined pitch multiplied by M/N.

8. A method as claimed in claim 5, wherein said step of shaping is conducted so as to form said electron beam elements such that each of said electron beam elements of one electron beam group is offset from a corresponding electron beam element of the other electron beam group in said first and second directions by said predetermined pitch multiplied by M/N.

9. A method as claimed in claim 5, wherein said step of shaping comprises a step of forming said plurality of electron beam elements such that said exposure dots are formed on said object in a first exposure dot row and a second exposure dot row, each thereof including a plurality of exposure dots aligned in said first direction with a pitch twice as large as said predetermined pitch, said dots forming said second exposure dot row being shifted with respect to said dots forming said first exposure dot row by one pitch in said first direction, such than said first exposure dot row and said second exposure dot row are repeated alternately in said second direction.

10. A method as claimed in claim 5, wherein said step of radiating said plurality of electron beam elements comprises, in each of said plurality of electron beam groups, a step of repeatedly forming said exposure dots on said object by scanning said plurality of electron beam elements, aligned in said first direction, in said second direction, such that said plurality of exposure dots are repeatedly exposed on said object a plurality of times.

11. A method as claimed in claim 10, wherein at least one of said steps of repeatedly forming said exposure dots is conducted such that said plurality of exposure dots forms an exposure pattern on said object in a current forming step is different from an exposure pattern formed by the exposure dots in a prior forming step.

12. A method as claimed in claim 11, wherein said exposure dots forming said exposure pattern of the current forming step have a dot density that is different from a dot density of the exposure pattern of the prior forming step.

13. An electron beam exposure system for exposing a pattern on an object by a focused electron beam, comprising:
   electron beam source means for producing an electron beam and emitting the beam along an optical axis;
   focusing means, provided on said optical axis, for focusing said electron beam on said object;
   electron beam shaping means for shaping said electron beam and thereby forming a plurality of electron beam elements of a common size and shape;
   shaping control means for controlling said electron beam shaping means such that said plurality of electron beam elements are formed according to a desired exposure pattern;
   deflection means for deflecting said plurality of shaped electron beam elements with respect to said optical axis;
   said electron beam shaping means comprising a mask plate provided with a plurality of apertures for shaping said single electron beam and thereby to form said plurality of electron beam elements in correspondence to said plurality of apertures and a deflection device, provided on each of said plurality of apertures, which selectively deflects each said electron beam element upon passage through a corresponding said aperture;
   said shaping control means producing, and supplying, a drive signal to said deflection device and forming said plurality of electron beam elements according to said desired exposure pattern;
   said plurality of apertures on said mask being arranged in a first direction and in a second, different direction with a predetermined pitch and thereby to form a plurality of aperture groups each extending in said first direction and repeated, in said second direction, N times and with said predetermined pitch;
   said shaping control means supplying drive signals to said deflection devices in said plurality of aperture groups such that the drive signal supplied to one of the aperture groups is independent of the drive signals supplied to the other aperture groups; and
   in each of said aperture groups, said apertures being repeated in said first direction with said predetermined pitch and such that each of said apertures is offset from a corresponding aperture in an adjacent aperture group by M/N pitches in at least one of said first and second directions wherein N stands for the number of aperture groups and M represents an arbitrary Integer smaller than N.

14. An electron beam exposure system as claimed in claim 13, wherein each of said aperture groups comprises a plurality of apertures aligned in said first direction so as to form an aperture row, said aperture rows being repeated in said second direction a plurality of times.

15. An electron beam exposure system as claimed in claim 14, wherein each of said aperture rows comprises a first aperture row of a plurality of apertures aligned in said first direction with an interval corresponding to twice said predetermined pitch, and a second aperture row of a plurality of apertures aligned in said first direction with an interval corresponding to twice said predetermined pitch, said apertures of said second aperture row being formed with a shift of one pitch in said first direction with respect to said apertures of said first aperture row.

16. An electron beam exposure system as claimed in claim 13, wherein said shaping control means further comprises delay means for aligning the timing of said plurality of drive signals with each other.

17. A method for exposing a pattern on an object by means of an electron beam, comprising the steps
   shaping a single electron beam so as to form a plurality of electron beam elements having a common size and shape and such that said plurality of electron beam elements forms an electron beam pattern;
   radiating said plurality of electron beam elements on said object thereby to expose said pattern on said object as an assembly of exposure dots arranged with a predetermined pitch; and said step of shaping the electron beam further comprising
  passing said electron beam through a mask which has a plurality of apertures that are selectively turned on and turned off in response to said pattern to be exposed on said object;
  adjusting the timing of energization of said apertures such that said respective energizations of said apertures are achieved coincident with a predetermined timing.

18. A method as claimed in claim wherein said step of shaping the electron beam further comprises:
  forming said plurality of electron beam elements, simultaneously, as a plurality of electron beam groups, each including said electron beam elements in alignment in a first direction and such that said electron beam elements aligned in said first direction are repeated in a second direction perpendicular to said first direction; and
  forming an electron beam elements included in one of said electron beam groups, with respect to an electron beam element, included in other electron beam groups, with an offset of said predetermined pitch multiplied by M/N in at least one of said first and second directions, wherein N stands for number of the electron beam groups and M represents an arbitrary integer smaller than N.

19. A method as claimed in claim 17, wherein:
  said step of detecting the timing comprises a step of detecting the timing of energization of the apertures for each of said plurality of aperture groups; and
  said step of adjusting the timing comprises storing the detected timing in a memory, searching for the aperture that has the largest delay in the timing, and delaying the timing of energization of the apertures such that the timing of energization of the apertures coincides with the timing of energization of the aperture that has the largest delay.

20. A method as claimed in claim 17, wherein said step of detecting the timing comprises detecting the timing of drive signals that are supplied to the apertures on said mask.

21. A method as claimed in claim 17, wherein said step of detecting the timing further comprises detecting the timing of arrival of the electron beef elements on said object.

22. A method for exposing a pattern on an object, comprising the steps
  producing an electron beam such that said electron beam travels toward said object along an optical axis;
  shaping said electron beam according to exposure data and so as to form a plurality of electron beam elements aligned in a first direction and having a common, identical size and shape and such that said plurality of electron beam elements forms an exposure pattern corresponding to said exposure data;
  scanning said electron beam elements in a second direction, perpendicular to said first direction, thereby to expose said object;
  said step of shaping further comprising the steps of:
    (a) shaping said electron beam according to first exposure data to form first electron beam elements; and
    (b) shaping said electron beam according to second exposure data to form second electron beam elements;
  said step of scanning being conducted such that said first electron beam elements scan over a first area of said object said second electron beam elements scan over a second area of said object, and said first area overlaps with said second area; and
  said steps (a) and (b) being conducted such that each of said first electron beam elements has a beam density, indicative of the number of the electron beam elements radiated upon a unit area, which is substantially smaller than the beam density of said second beam elements.

* * * * *

UNITED STATES PATENT AND TRADEMARK OFFICE
CERTIFICATE OF CORRECTION

PATENT NO. : 5,369,282
DATED : November 29, 1994
INVENTOR(S) : ARAI et al.

It is certified that error appears in the above-indentified patent and that said Letters Patent is hereby corrected as shown below:

Col. 3, line 56, change "1B . . ." to --1B, ...--.

Col. 4, line 43, after "such" delete -,--.

Col. 5, line 47, delete "in".

Col. 9, line 45, change "showing the" to --showing a--;
line 64, after "according to" insert --a--.

Col. 10, line 11, change "beams" to --beam--;
line 54, change "BAAA" to --BAA--;
line 57, after "stripe" insert --,--.

Col. 11, line 36, change "2B" (first occurrence) to --1B--.

Col. 12, line 27, after "ing" insert --respective,--.

Col. 14, line 65, change "inward" to --inwardly--.

Col. 15, line 10, change "displacement" to --displacements--;
line 46, delete "both"; and after "Y-directions" delete ",".

Col. 17, line 57, after "other" insert --,--; and after "in" insert --each of--.

Col. 18, line 51, change "further by," to --further, by--.

Col. 22, line 6, change "ignorable" to --ignored--.

Col. 23, line 17, after "drawings" insert --,--;
line 65 (claim 1, line 8), after "object" insert --,--.

UNITED STATES PATENT AND TRADEMARK OFFICE
CERTIFICATE OF CORRECTION

PATENT NO. : 5,369,282
DATED : November 29, 1994
INVENTOR(S) : ARAI et al.

It is certified that error appears in the above-indentified patent and that said Letters Patent is hereby corrected as shown below:

Col. 24, line 57 (claim 5, line 23), change "So" to --so--.

Col. 26, line 37 (claim 13, last line), change "Integer" to --integer--;
line 59 (claim 17, line 2), after "steps" insert --of:--.

Col. 27, line 2 (claim 17, line 13), after "prising" insert --:--;
line 6 (claim 17, line 17), change ";" to --,--;
after line 6 (claim 17, between lines 17 and 18), insert the following paragraph:
--detecting the timing of energization of said apertures, and--;
line 11 (claim 18, line 1), after "claim" insert --17,--
line 20 (claim 18, line 10), change "elements" to --element,--;
line 21 (claim 18, line 11), change "groups ," to --groups,--.

Col. 28, line 5 (claim 21, line 3), change "beef" to --beam--;
line 8 (claim 22, line 2), after "steps" insert --of:--;
line 25 (claim 22, line 19), change ";" to --,--;
lines 26-28 (claim 22, lines 20-22), paragraph (b) should be indented in the same manner as paragraph (a), lines 23-25 (claim 22, lines 17-19);
line 31 (claim 22, line 25), after "object" insert --,--.

Signed and Sealed this

Thirtieth Day of May, 1995

*Attest:*

BRUCE LEHMAN

*Attesting Officer*   *Commissioner of Patents and Trademarks*